(12) United States Patent
East et al.

(10) Patent No.: US 7,549,460 B2
(45) Date of Patent: Jun. 23, 2009

(54) THERMAL TRANSFER DEVICES WITH FLUID-POROUS THERMALLY CONDUCTIVE CORE

(75) Inventors: W. Joe East, Hampton, VA (US); Elliot Weiss, Hampton, VA (US)

(73) Assignee: Adaptivenergy, LLC, Hampton, VA (US)

( * ) Notice: Subject to any disclaimer, the term of this patent is extended or adjusted under 35 U.S.C. 154(b) by 501 days.

(21) Appl. No.: 11/025,845

(22) Filed: Dec. 30, 2004

(65) Prior Publication Data

US 2005/0257917 A1    Nov. 24, 2005

Related U.S. Application Data

(63) Continuation-in-part of application No. 10/815,992, filed on Apr. 2, 2004, now abandoned.

(51) Int. Cl.
*F28F 7/00* (2006.01)
*F28D 15/00* (2006.01)
*H05K 7/20* (2006.01)

(52) U.S. Cl. .................. 165/80.4; 165/104.33

(58) Field of Classification Search .............. 165/80.4, 165/80.3, 185, 104.33, 104.34, 125, 126; 361/699, 700; 257/714
See application file for complete search history.

(56) References Cited

U.S. PATENT DOCUMENTS

| | | | |
|---|---|---|---|
| 4,016,928 A | 4/1977 | Bertels et al. | |
| 4,147,210 A | 4/1979 | Pronko et al. | |
| 4,359,181 A | 11/1982 | Chisholm | |
| 4,577,398 A | 3/1986 | Sliwa et al. | |
| 4,717,433 A | 1/1988 | Weisert et al. | |
| 4,843,693 A | 7/1989 | Chisholm | |
| 4,880,052 A | 11/1989 | Meyer, IV et al. | |
| 4,981,172 A | 1/1991 | Haerle | |
| 5,180,001 A | 1/1993 | Okada et al. | |
| 5,195,576 A | 3/1993 | Hatada et al. | |

(Continued)

OTHER PUBLICATIONS

Zheng et al, "Cylindrical Pin-Fin Fan-Sink Heat Transfer and Pressure Drop Correlations", IEEE Trans. Components and Packaging Technology, vol. 25, also ASME/JSME Thermal Engineering Joint Conference Proceedings, paper AJTE99-6197, 1999.

(Continued)

*Primary Examiner*—Tho V Duong
(74) *Attorney, Agent, or Firm*—Nixon & Vanderhye, P.C.

(57) ABSTRACT

A thermal transfer device (20) comprises a housing having a base assembly (23) and a cover (22). The base assembly (23) comprises a thermal transfer base (25) and a fluid-porous, thermally conductive mesh structure (26). The thermal transfer base (25) and the cover (22) cooperate to define a thermal transfer chamber (24). The thermally conductive mesh structure (26) is configured and positioned in the chamber (24) to provide a tortuous, thermal conduction path for fluid (e.g., a coolant) which turbulently travels from an inlet (40) of the chamber to one or more outlets (42) of the chamber (24). In some embodiments, the mesh structure comprises wires which are fused by diffusion bonding into a mesh, in other embodiments the mesh comprises a metallic wool. Within the chamber the mesh structure (26) can have various configurations for providing an exposure interface between fluid pumped through the chamber and the mesh.

21 Claims, 19 Drawing Sheets

U.S. PATENT DOCUMENTS

| | | | |
|---|---|---|---|
| 5,312,508 | A | 5/1994 | Chisholm |
| 5,325,913 | A | 7/1994 | Altoz |
| 5,358,032 | A * | 10/1994 | Arai et al. ............... 165/80.3 |
| 5,422,787 | A | 6/1995 | Gourdine |
| 5,463,528 | A * | 10/1995 | Umezawa ................. 361/699 |
| 5,491,363 | A | 2/1996 | Yoshikawa |
| 5,518,071 | A | 5/1996 | Lee |
| 5,526,867 | A | 6/1996 | Keck et al. |
| 5,583,317 | A | 12/1996 | Mennucci et al. |
| 5,607,778 | A | 3/1997 | Padden |
| 5,688,716 | A | 11/1997 | DiStefano et al. |
| 5,777,259 | A | 7/1998 | Mennucci et al. |
| 5,987,893 | A | 11/1999 | Schulz-Harder et al. |
| 6,014,312 | A | 1/2000 | Schulz-Harder et al. |
| 6,018,459 | A | 1/2000 | Carlson et al. |
| 6,055,154 | A * | 4/2000 | Azar ......................... 361/688 |
| 6,105,373 | A * | 8/2000 | Watanabe et al. ............ 62/3.7 |
| 6,317,326 | B1 | 11/2001 | Vogel et al. |
| 6,328,529 | B1 * | 12/2001 | Yamaguchi et al. ......... 415/178 |
| 6,351,384 | B1 * | 2/2002 | Daikoku et al. ............ 361/704 |
| 6,561,267 | B2 | 5/2003 | Sauciuc et al. |
| 6,778,398 | B2 | 8/2004 | Wyland |
| 6,840,308 | B2 | 1/2005 | Ritter et al. |
| 6,867,973 | B2 * | 3/2005 | Chang ....................... 361/699 |
| 6,898,082 | B2 * | 5/2005 | Dessiatoun et al. ........ 361/699 |
| 2002/0108743 | A1 | 8/2002 | Wirtz |
| 2003/0062151 | A1 * | 4/2003 | Sauciuc et al. .............. 165/185 |
| 2003/0227732 | A1 | 12/2003 | Dessiatoun et al. |

OTHER PUBLICATIONS

Wirtz, "High Performance Woven Mesh Heat Exchange", F49620-99-1-0286, 1999.

"High Performance Woven Mesh Heat Exchange", Research Summary, AFOSR Contractors' Meeting in Turbulence and Rotation Flows, Albuquerque, NM, Aug. 18, 2000, pp. 9-21.

Xu et al, "In-Plane Effective Thermal Conductivity of Plain Weave Screen Laminates with Arbitrary Weave Parameters", Paper TED-AJ03-417, $6^{th}$ ASME/JSME Thermal Engineering Joint Conference, Hawaii, Mar. 16-20, 2003.

Xu et al, "In-Plane Effective Thermal Conductivity of Plain-Weave Screen Laminates", IEEE Trans. on Components and Packaging Tech., vol. 25, #4, 2003. See also Proc. THERMES 2002, pp. 231-242, Millpress, Rotterdam, Jan. 2002.

Wirtz et al, "Thermal/Fluid Characteristics of 3-D Woven Mesh Structures as Heat Excahnger Surfaces", IEEE Trans Components and Packaging Technology, vol. 26, 2003, pp. 40-47. See also paper 1372, Eighth Intersociety Conference on Thermal Phenomeno in Electronic Systems, San Diego, CA.

Li et al, "Development of a High-Performance Heat Sink Based on Screen-Fin Technology", Proc 19-th Semiconductor Thermal Measurement and Management Symposium, IEEE 02CH37437, Mar. 6-10, 2003, pp. 53-60.

International Search Report and Written Opinion mailed Sep. 9, 2005 in corresponding PCT application No. PCT/US2005/11343.

* cited by examiner

THERMAL TRANSFER DEVICES WITH FLUID-POROUS THERMALLY CONDUCTIVE CORE

This application is a continuation-in-part of U.S. patent application Ser. No. 10/815,992, filed Apr. 2, 2004 now abandoned, entitled "DIFFUSION BONDED WIRE MESH HEAT SINK", which is incorporated herein by reference in its entirety.

BACKGROUND

1. Field of the Invention

This invention pertains to cooling or heat dissipating devices (e.g., thermal transfer devices) such as heat sinks and thermal exchangers, and particularly to devices which accomplish thermal transfer by a circulating fluid.

2. Related Art And Other Considerations

Various types of equipment create or release heat during operation. In some cases the heat can be injurious to the equipment or its environment (e.g., other equipment or components in proximity to the heat-generating or heat-releasing equipment). Accordingly, attempts have been made in some such cases to cool the equipment and/or its environs. Common cooling techniques include circulation of a cooling fluid around or near the source of heat. For example, fans have been used to blow cooling air around a heat-generating component of a system. Alternatively, heat pipes or other types of heat sinks have been placed in contact or nearby the heat source for the purpose of dissipating the heat using, e.g., circulating air.

Among the types of equipment prone to heat generation/release are some electronic components, such as microprocessors, for example. As microprocessor manufacturers are running the microprocessor chips at higher and higher frequencies in order to obtain maximum performance, the chips can build up enough heat to cause failures. In fact, the heat can become so great in many chips that conventional means of cooling (e.g., fans and heat pipes) are not sufficiently effective.

In view of the inadequacy of conventional cooling techniques, fluid cooling of heat generating/releasing components (e.g., electronic chips) is gaining momentum. For example, for cooling purposes a fluid is pumped through a heat sink in contact with the chip die to pick up heat from the chip die. The fluid is then pumped to a heat exchanger for cooling the fluid before the fluid is routed back to the heat sink to pick up and remove more heat.

Some fluid-accommodating heat sinks employ microchannel technology. That is, the heat sinks have "microchannels" through which the cooling fluid travels as it is pumped. The microchannels are very small channels formed in or on a heat sink surface, or the chip die. The heat sink surface with the microchannels may be flush with or otherwise in contact with a surface of a device to be cooled (e.g., chip die).

Despite their proven potential for handling high heat fluxes, microchannel-based heat sinks have not found widespread commercial use, possibly due to the very high pressure drops encountered in the microchannels. High pressure drops necessitate the use of relatively large pumps with significant power requirements, noise, reliability issues, and associated costs.

Moreover, there can be a problem if bubbles form in microchannel-type heat sinks. When a bubble forms in a microchannel of a heat sink, the bubble tends not to exit the channel. Instead, the bubble remains essentially stationary in the microchannel. Since the remaining bubble occludes the cooling fluid flow, a hot spot may develop in or on the device being cooled. If the hot spot grows significantly, the device being cooled may fail.

What is needed, therefore, and an object of this invention, is an efficient and effective thermal transfer device.

BRIEF SUMMARY

A thermal transfer device comprises a housing including a thermal transfer base which at least partially defines a thermal energy transfer chamber. A fluid-porous, thermally-conductive core structure, such as a mesh structure, is diffusion bonded or otherwise affixed within the thermal transfer chamber. The core or mesh structure is configured and positioned in the chamber to provide a tortuous, thermal energy conduction path for fluid (e.g., a coolant) which turbulently travels from an inlet of the chamber to one or more outlets of the chamber.

The fluid-porous, thermally-conductive core structure can comprise, for example, either wires or expanded metal which are configured into a mesh, or a fluid-porous metallic wool. In some embodiments, the thermal core takes the form of a thermal mesh structure comprising woven wires, and particularly woven wires which are fused by diffusion bonding into a mesh. For example, the wires comprising the wire mesh structure can be fused as a diffusion bond is formed between tangent metal surfaces when enough atoms or molecules migrate between them to create new metallurgical grains which bridge the gap. The diffusion bonding of the wires provides the wire mesh structure with many and appropriately sized interstices, making it easier to push the fluid through the thermal transfer device and thereby significantly reducing the size and power of the pump which pushes the fluid.

The core, whether comprised of an expanded mesh or a diffusion bonded mesh, has greater numbers of fluidic paths and thus far less pressure drop than a microchannel device. Further, the thermal transfer efficiency is increased due to the fact that the mesh structure has such a large surface area, up to five to ten times more that a standard microchannel heat sink.

In other embodiments, wires comprising a woven wire thermal mesh structure can be configured or fused by other means or techniques, such as unbonded mesh or dip brazed mesh, for example, or fused by soldering, welding, and/or epoxying.

In embodiments in which wires of the thermal mesh structure are fused in a diffusion bonding process, the wire mesh structure can be fused to either or both of the thermal transfer base or the housing cover during a different or (more preferably) the same diffusion bonding process. The diffusion bonding of the wire mesh structure to the thermal transfer base to create the base assembly allows for higher efficiency in transferring thermal energy from the thermal transfer base to the wire mesh structure. Alternatively, as with essentially all embodiments described herein, the core or mesh structure can be secured or adhered to the thermal transfer base by numerous conventional techniques such as (for example) soldering, welding, radio frequency (RF) melting, and adhesives which are cured or activated (e.g., by thermal energy, by voltage, etc.). Bonding of the housing cover to the thermal mesh enables the cover to be a more active thermal energy dissipater For those embodiments of thermal transfer devices which utilize a wire mesh as the fluid-porous, thermally-conductive core, various differing cross-sectional configurations of the mesh wires are possible. Each of the differing wire cross sectional configurations provide a different degree of exposure (e.g., surface area) for promoting thermal transfer. Further, the cross sectional shapes of the wires contribute to a pressure differential which affects tortuous flow, and thus the degree of thermal transfer.

In embodiments in which the thermal mesh structure comprises a fluid-porous metallic wool, the wool can be of any suitable thermally conductive metal, such as (by way of non-limiting example) copper wool or brass wool.

Regardless of manner of affixing the thermal core or mesh, within the chamber the thermal mesh structure can have various configurations for providing an exposure interface between fluid pumped through the chamber and the thermal mesh. In one example embodiment, the thermal mesh structure is folded in an essentially serpentine configuration within the chamber. A path of the fluid in the chamber from the inlet to the outlet is preferably not parallel to the fold axes, and more preferably is substantially perpendicular to the fold axes. In one non-limiting implementation of this embodiment in which the housing has an essentially parallelepiped shape and includes the thermal transfer base and four side walls, the inlet and the outlet are provided on opposing sidewalls that are parallel to the fold axes.

In another example embodiment, the thermal mesh structure (whether comprised of expanded metal or woven wire) has an essentially spiral configuration within the chamber. In yet another example embodiment, the thermal mesh structure has an essentially circular configuration within the chamber, and preferably is configured to comprise plural concentric rings within the chamber. In certain example implementations of the spiral and circular/concentric embodiments in which the housing has an essentially parallelepiped shape, the housing includes the thermal transfer base, four side walls, and a port wall which is opposite the thermal transfer base, with the inlet and the outlet being provided on the port wall. In one implementation, the inlet and outlet communicate through respective channels formed in the port wall so that fluid travels through the channels in a direction which is essentially parallel to a plane of the thermal transfer base. In this manner, fluid is introduced centrally into the chamber and pumped to one or more corners of the housing. In embodiments in which the housing has plural outlets, downstream from the outlets the outlets may be connected to a common discharge tube.

In embodiments in which the fluid is introduced centrally into the chamber through an inlet in the port wall, a nozzle from which the fluid is discharged may either be situated proximate the port wall, or (more preferably) may protrude into the thermal transfer chamber so that, upon discharge, the fluid immediately and directly impinges on the thermal transfer base.

In one embodiment in which the thermal mesh is a woven wire mesh, the mesh comprises wires having an essentially uniform spacing therebetween, but wherein at least one wire proximate an inside surface of the thermal transfer has a non-uniform spacing relative to either the thermal transfer base or another wire comprising the mesh. For example, the non-uniform spacing is a multiple K of the uniform spacing.

In some example embodiments the thermal core comprises expanded metal which has been stretched (using, e.g., heat treatment) and scored, punctured, or otherwise deformed to form channels and interstices which facilitate fluid flow.

The thermal transfer devices are useful in a thermal dissipation system in which the thermal transfer base of the thermal transfer device is situated in thermal conducting relation with a body to be thermally treated, and which further includes a thermal exchanger and a pump. The pump serves to move fluid through a circulation path including the thermal transfer device and the thermal exchanger. The circulation path is configured so that after the thermal energy is transferred to the fluid in the thermal transfer device, the fluid is cooled or heated by the thermal exchanger prior to the fluid being circulated back to the thermal transfer device.

DETAILED DESCRIPTION

Figure 1A:
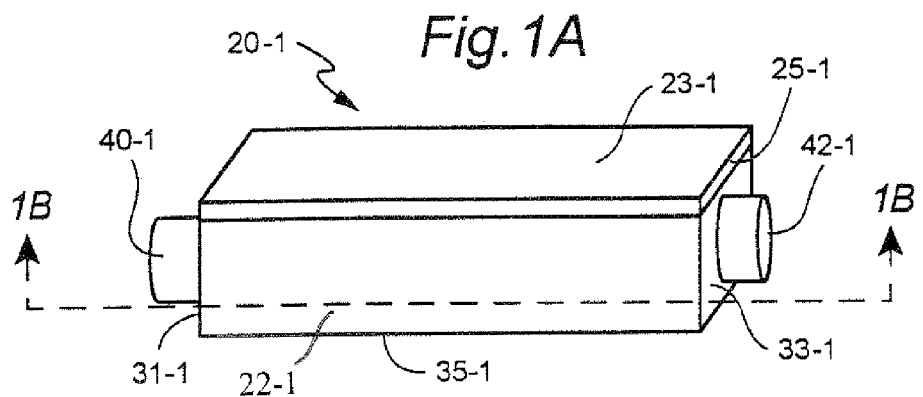
FIG. 1A is a perspective top and side view of a thermal transfer device according to a first example embodiment.

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. In other instances, detailed descriptions of well-known devices, circuits, and methods are omitted so as not to obscure the description of the present invention with unnecessary detail.

Thermal transfer devices as described herein advantageously comprise a housing which at least partially defines a thermal transfer chamber and a fluid-porous, thermally-conductive core or mesh structure situated in the thermal transfer chamber. The housing includes a thermal transfer base and a cover. The thermal core structure of the thermal transfer device is configured and positioned in the chamber to provide a tortuous, thermal conduction path for fluid (e.g., a coolant, such as a liquid coolant) which turbulently travels from an inlet of the chamber to one or more outlets of the chamber. As such, the core facilitates fluid travels through the chamber in essentially every direction, moving with turbulence and thereby increasing thermal transfer capability.

The fluid-porous, thermally-conductive core can comprise, for example, a mesh structure formed either by expanded metal or woven wires which are configured into a mesh or a fluid-porous metallic wool. In some embodiments, the thermal mesh structure comprises wires which are fused by diffusion bonding into a mesh. For example, the wires comprising the wire mesh structure can be fused as a diffusion bond is formed between tangent metal surfaces when enough atoms or molecules migrate between them to create new metallurgical grains which bridge the gap. The diffusion bonding of the wires provides the wire mesh structure with many and appropriately sized interstices, making it easier to push the fluid through the thermal transfer device and thereby significantly reducing the size and power of the pump which pushes the fluid.

Whether the thermal mesh is formed by extruded metal or diffusion bonded woven wire, the mesh has greater numbers of fluidic paths and thus far less pressure drop than a microchannel device. Further, the thermal transfer efficiency is increased due to the fact that the thermal mesh structure has such a large surface area, up to five to ten times more that a standard microchannel heat sink.

In other embodiments which utilize woven wire, wires comprising the thermal mesh structure can be configured or fused by other means or techniques, such as unbonded mesh or dip brazed mesh, for example, or fused by soldering, welding, and/or epoxying.

In embodiments in which wires of the thermal mesh structure are fused in a diffusion bonding process, the wire mesh structure can be fused to the thermal transfer base and even the housing cover during a different or (more preferably) the same diffusion bonding process. The diffusion bonding of the wire mesh structure to the thermal transfer base to create the base assembly allows for higher efficiency in transferring thermal energy from the thermal transfer base to the wire mesh structure. Alternatively, as with essentially all embodiments described herein, the mesh structure can be secured or adhered to the thermal transfer base and (optionally) to the housing cover by numerous conventional techniques such as (for example) soldering, welding, radio frequency (RF) melting, and adhesives which are cured or activated (e.g., by thermal energy, by voltage, etc.). Bonding of the thermal mesh to the housing cover enables the housing cover to be an active thermal dissipater.

In embodiments in which the thermal mesh structure comprises a fluid-porous metallic wool, the wool can be of any suitable thermally conductive metal, such as (by way of non-limiting example) copper wool or brass wool.

In some example implementations and embodiments the thermal core comprises extruded metal which has been stretched (using, e.g., heat treatment) and scored, punctured, or otherwise deformed to form channels which facilitate fluid flow.

Regardless of manner of composition or affixation, the thermal core structure has many and appropriately sized interstices, making it easier to push the fluid through the cooling device and thereby significantly reducing the size and power of the pump which pushes the fluid. Further, the thermal transfer efficiency is increased due to the fact that the thermal core structure has such a large surface area. This greater surface area provided by the thermal core structure facilitates more exposure of the fluid to the thermal transferring metal, and thus a lesser degree of fluid flow, and hence less pressure required for pumping the fluid through the chamber of the cooling device.

Described herein are non-limiting, representative example embodiments which position a thermal core in a thermal transfer chamber of a cooling device. The thermal transfer chamber ("chamber" for short) is primarily defined by a thermal transfer base and a cover. The thermal transfer base can also be termed a thermal transfer plate, especially when having an essentially flat rectangular shape. The thermal transfer chamber has an inlet and one or more outlets, preferably but not exclusively formed in the cover. In the chamber the thermal core structure can have various configurations for providing an exposure interface between fluid pumped through the chamber and the thermal core. Thermal transfer devices other than those particularly illustrated and described herein are within the purview of the invention. Moreover, the invention is not confined to any particular configuration of one or more elements comprising the thermal transfer device, e.g., not confined to any configuration of the thermal core structure or of the chamber or of the housing or cover.

Figure 1B:
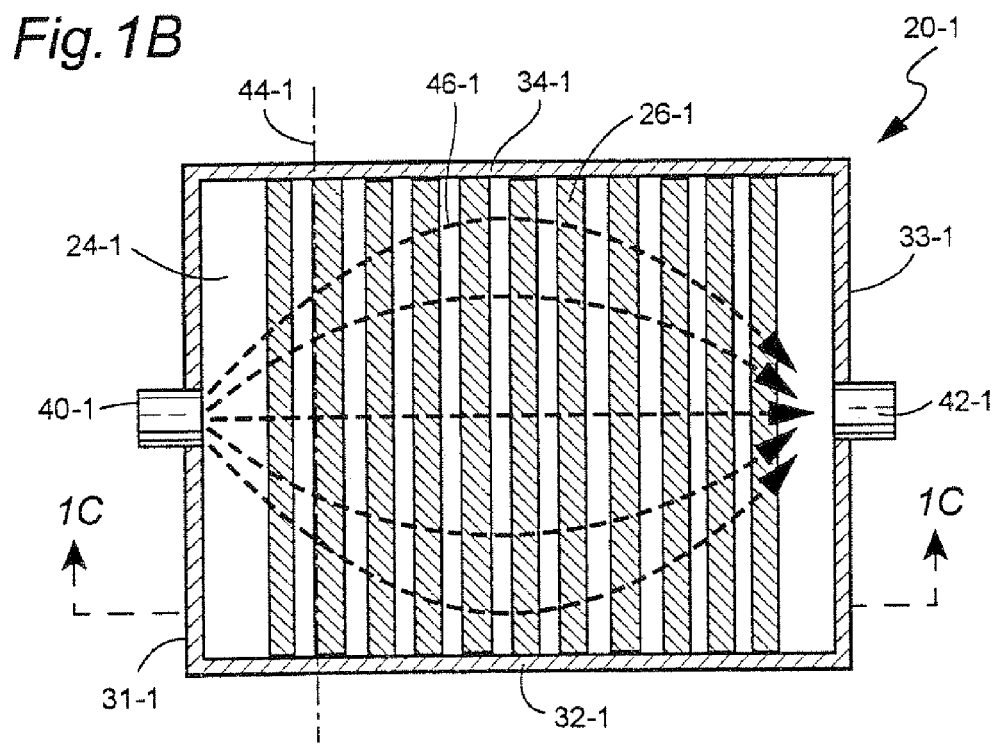
FIG. 1B is a bottom view of the thermal transfer device of FIG. 1A taken along the line 1B-1B.
Figure 1C:
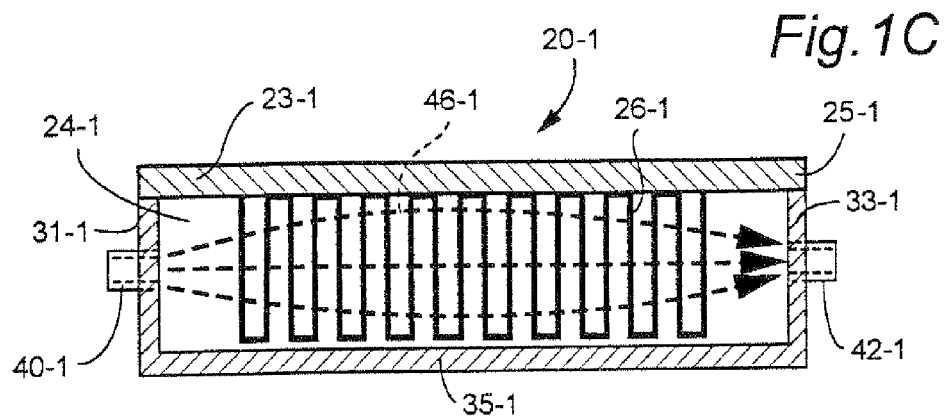
FIG. 1C is a side view of the thermal transfer device of FIG. 1A taken along the line 1C-1C.

FIG. 1A, FIG. 1B, and FIG. 1C illustrate a first example embodiment of a thermal transfer device 20-1. The thermal transfer device 20-1 comprises a housing which includes a cover 22-1 and a base assembly 23-1. The cover 22-1 fits over the base assembly 23-1 so that a thermal transfer chamber 24-1 is defined therein. The base assembly 23-1 comprises a thermal transfer base 25-1 which, in this particularly illustrated embodiment, is integral with a thermal core, which in this embodiment takes the form of thermal mesh 26-1. In the FIG. 1 embodiment the thermal mesh can be either an expanded metal mesh or a diffusion bonded wire mesh. As in all embodiments described herein, the thermal transfer base 25-1 is a conductive material such as a conductive metal. Preferably the base plate 25-1 is comprised of the same metal (e.g., copper) as the metal which forms the thermal core. The thermal mesh structure 26-1 of the base assembly 23-1 extends into the chamber 24-1.

In like manner as some of the other embodiments illustrated herein, the cover 22-1 is essentially a parallelepiped. In fact, the cover 22-1 of the first embodiment is a rectangular parallelepiped having one open face. As such, the cover 22-1 has five walls. The walls of the cover 22-1 include side walls 31-1, 32-1, 33-1, and 34-1, as well as cover wall 35-1. The cover wall 35-1 lies in a plane which is parallel to thermal transfer base 25-1. When the thermal transfer device is assembled, the open face of cover 22 is closed by thermal transfer base 25-1. FIG. 1A, FIG. 1B, and FIG. 1C show the thermal transfer device 20-1 with thermal transfer base 25-1 surmounting the cover 22-1.

The thermal transfer base 25-1 can be secured to cover 22 by any suitable fasteners or adhesives such as, e.g., threaded fasteners. FIG. 1B shows the interior of the chamber looking up from cover wall 35-1 toward the underside of thermal transfer base 25-1, thereby also permitting a view of the thermal mesh structure 26-1.

Cover 22-1 has an inlet 40-1 through which fluid enters the chamber 24-1 and an outlet 42-1 through which the fluid exits the chamber 24-1. In the first embodiment, the inlet 40-1 and the outlet 42-1 are provided on opposing sidewalls 31-1 and 33-1, respectively, of cover 22-1. Other inlet/outlet arrangements are also possible, including plural inlets on one sidewall and opposing outlets on an opposing sidewall, with inlet(s) and outlet(s) being aligned or non-aligned, etc.

As with other embodiments hereinafter described, it should be appreciated that the housing could be formed so that the inlet and outlet(s) are provided in members other than the cover. For example, additional constituent elements of the housing other than the cover and thermal transfer base, with the inlet and outlet(s) being provided in the other constituent elements. Alternatively, in other embodiments the thermal transfer base itself are formed to include sidewalls through which an inlet and outlet(s) are positioned.

As for all embodiments herein described, it will also be appreciated that the housing of the thermal transfer device need not necessarily be rectangular, but that other geometries are possible. For example, the thermal transfer device housing can be cylindrical or disk-shaped. One factor in the geometry for the thermal transfer device housing is the shape, configuration, and size of a device to be thermally treated by the thermal transfer device.

In one non-limiting example implementation, the thermal mesh structure 26-1 comprises woven wires which are configured into a mesh. In another example implementation the thermal mesh structure 26-1 comprises expanded metal.

In the diffusion bonded woven wire mesh embodiments the wires comprising the thermal mesh structure can be fused as a diffusion bond is formed between tangent metal surfaces when enough atoms or molecules migrate between them to create new metallurgical grains which bridge the gap. As mentioned before, in other embodiments, the wires of the thermal mesh structure can be configured by other means or techniques.

The mesh structure 26-1 is situated in the chamber 24-1 to transfer thermal energy acquired from the thermal transfer base 25-1 to the fluid in the chamber 24-1 as the fluid is pumped through interstices of the wire mesh structure 26-1. The thermal mesh structure of the base assembly is configured and positioned in the chamber to provide a tortuous, thermal conduction path for fluid (e.g., a coolant) which turbulently travels from the inlet 40-1 of the chamber to one or more outlets 42-1 of the chamber.

The thermal core, e.g., thermal mesh, can be bonded to the housing cover. Such bonding of the thermal mesh to the housing cover can be by diffusion bonding in those embodiments wherein diffusion bonding is employed, or by other bonding techniques such as those elsewhere mentioned herein.

As shown in FIG. 1C, the thermal mesh structure 26-1 of the first embodiment is folded in an essentially serpentine configuration within the chamber. One such fold axis for the thermal mesh structure 26-1 is depicted as axis 44, which essentially lies along a line parallel to planes of wide wall 31-1 and side wall 33-1. Fold axes are provided at each crest and trough of the serpentine thermal mesh structure 26-1. The fold axes may comprise right angle bends in the manner shown in FIG. 1C, or alternatively may be curved so that the serpentine diffusion bonded thermal mesh structure 26-1 has more of an undulating shape rather than the strict zig-zag shape shown in FIG. 1C.

Due to pumping action, in operation a fluid travels through chamber 24-1 from the inlet 40-1 to the outlet 42-1. Some of the paths of the fluid in the chamber from the inlet 40-1 to the outlet 42-1 are generally depicted by arrows 46-1 in FIG. 1B and FIG. 1C. The paths of fluid travel are thus preferably not parallel to the fold axes 44-1, and more preferably some paths are substantially perpendicular to the fold axes 44-1. Such paths are facilitated by the fact that the inlet 40-1 and the outlet 42-1 are provided on opposing sidewalls 31-1, 33-1, respectively, that are parallel to the fold axes 44-1.

Figure 2A:
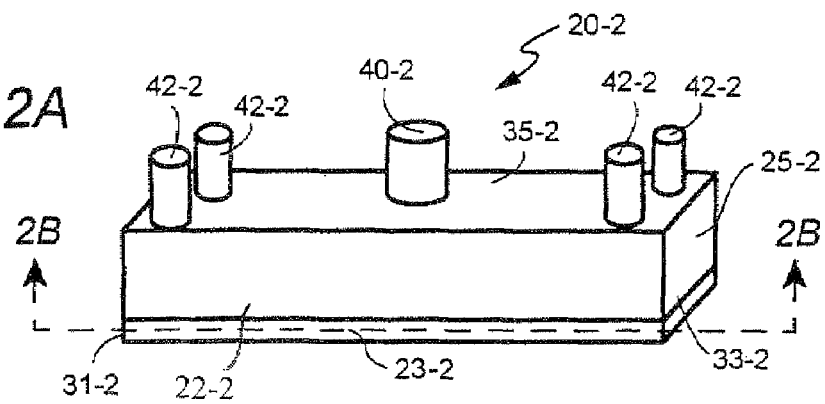
FIG. 2A is a perspective top and side view of a thermal transfer device according to a second example embodiment.
Figure 2B:
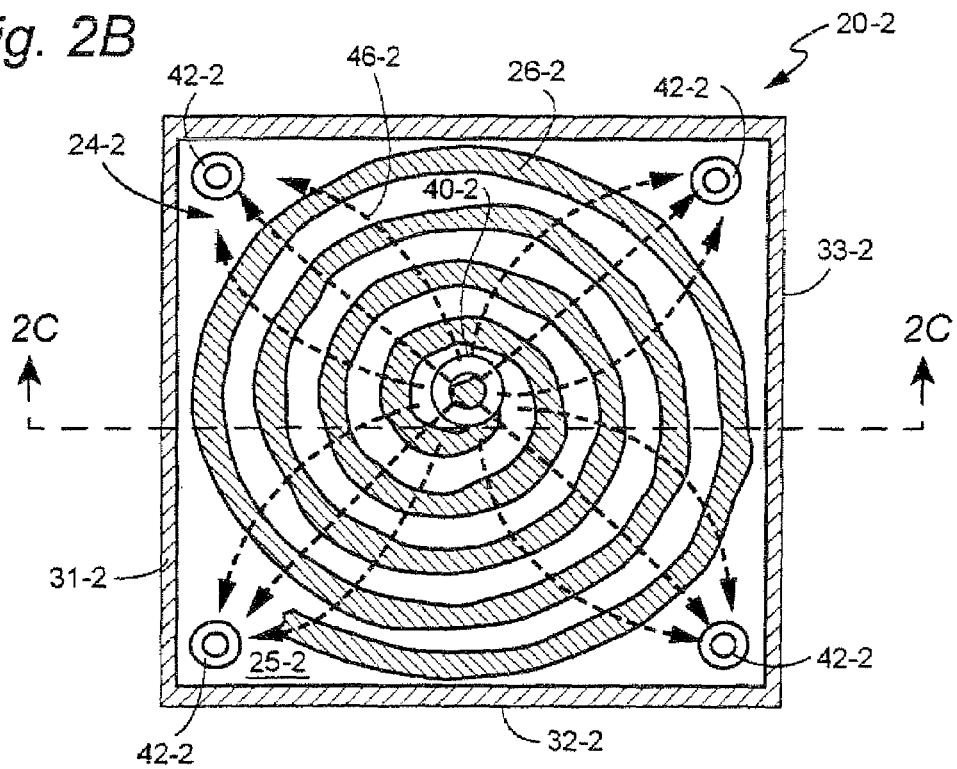
FIG. 2B is a bottom view of the thermal transfer device of FIG. 2A taken along the line 2B-2B.
Figure 2C:
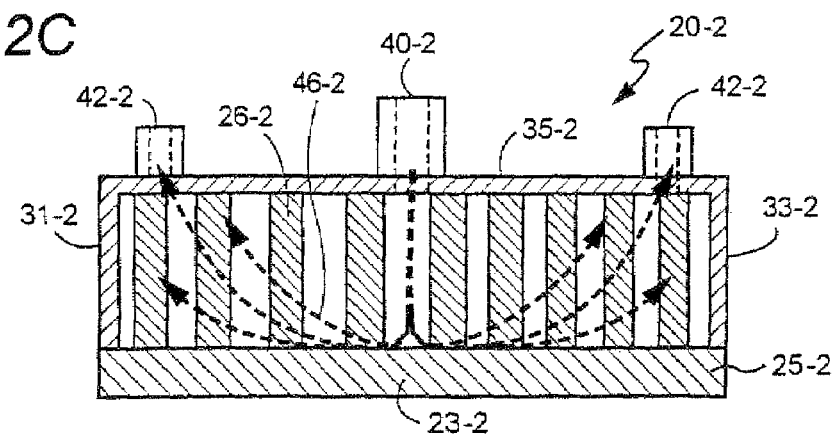
FIG. 2C is a side view of the thermal transfer device of FIG. 2A taken along the line 2C-2C.

FIG. 2A, FIG. 2B, and FIG. 2C illustrate a second example embodiment of a thermal transfer device 20-2. Unless otherwise excepted specifically or by context, comments concerning the first embodiment are also applicable to the second example embodiment and other embodiments described herein. For example, the thermal transfer device 20-2 comprises a housing which includes a cover 22-2 which cooperates with base assembly 23-2 to define chamber 24-2. A thermal core is situated in chamber 24-2, the thermal core in this embodiment taking the form of mesh structure 26-2. The mesh structure 26-2 can be a diffusion bonded wire mesh as previously explained, an expanded metal mesh, or configured in some other manner, e.g., a metallic wool. Although possibly being of differing shape and size, for illustration the cover 22-2 of the second embodiment is essentially a square parallelepiped having an open face and has five walls including side walls 31-2, 32-2, 33-2, and 34-2, as well as cover wall 35-2.

In the orientation of FIG. 2A the cover 22-2 is the uppermost, with thermal transfer base 25-2 being surmounted by cover 22-2. The thermal transfer base 25-2 has the mesh structure 26-2 secured to an inside surface thereof by, e.g., diffusion bonding or other technique. FIG. 2B shows the interior of the chamber looking up from thermal transfer base 25-2 toward the underside of cover wall 35-2, thereby also permitting a view of the mesh structure 26-2.

In the second embodiment, the cover wall 35-2 of cover 22-2 includes both a single inlet 40-2, as well as plural (e.g., four) outlets 42-2. In the illustrated version of the second embodiment, the single inlet is centrally located, while each of the four outlets 42-2 are situated in (e.g., proximate) a separate corner of cover wall 35-2. Other inlet/outlet arrangements are also possible, including plural inlets; greater or lesser than four outlets; differing placements on the cover wall 35-2 (or other housing elements) of the inlet(s) and/or outlet(s); or even providing the inlet(s) and/or outlet(s) on other walls of cover 22-2 or other housing elements.

As in the other embodiments, the mesh structure 26-2 is situated in the chamber 24-2 to transfer thermal energy acquired from the thermal transfer base 25-2 to the fluid in the chamber 24-2 as the fluid is pumped through interstices of the thermal mesh structure 26-2. As mentioned previously, preferably the thermal mesh structure is formed integrally with or bonded to the thermal transfer base 25-2, particularly when the mesh structure is a wire mesh which is diffusion bonded to the thermal transfer base in the same or different operation in which the wires of the wire mesh structure are bonded. As shown in FIG. 2C, the thermal mesh structure 26-2 of the second embodiment has an essentially spiral configuration within the chamber. The spiral pattern of the thermal mesh structure 26-2 has a first end near the center of the chamber 24-2 (e.g., near the inlet 40-2), and spirals radially outward toward the side walls of chamber 22-2. It will be appreciated that in the second embodiment and other embodiments discussed subsequently, only a few number of windings or rings of the mesh structure is shown for sake of simplicity, and likewise that the windings or rings are shown for sake of viewing as having exaggerated thickness. In reality, the windings or rings of the thermal mesh would not be observable without microscopic equipment.

Due to pumping action, in operation a fluid enters the chamber 24-2 through inlet 40-2 and is directed downward to impinge against the thermal transfer base 25-2. The impingement action of the fluid against thermal transfer base 25-2 creates a turbulence in the fluid. The turbulence is beneficial so that a laminar barrier of fluid does not reside on thermal transfer base 25-2, since a laminar barrier of fluid would tend to buffer the incoming fluid from the thermal transfer of the thermal transfer base 25-2. Moreover, the turbulence to the fluid imparted by the impingement action of the incoming fluid on the thermal transfer base 25-2 serves to scatter the fluid after the impingement into multitudinous directions and paths through the thermal mesh structure 26-2 and thus through the chamber 24-2 toward the outlets 42-2. Some of the paths of the fluid in the chamber from the inlet 40-2 to the outlet 42-2 are generally depicted by arrows 46-2 in FIG. 2B and FIG. 2C.

Figure 3A:
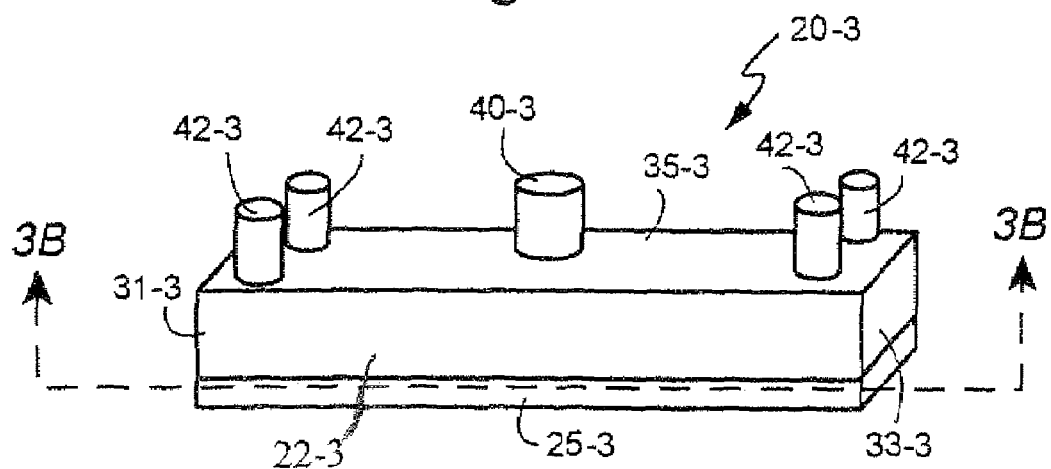
FIG. 3A is a perspective top and side view of a thermal transfer device according to a third example embodiment.
Figure 3B:
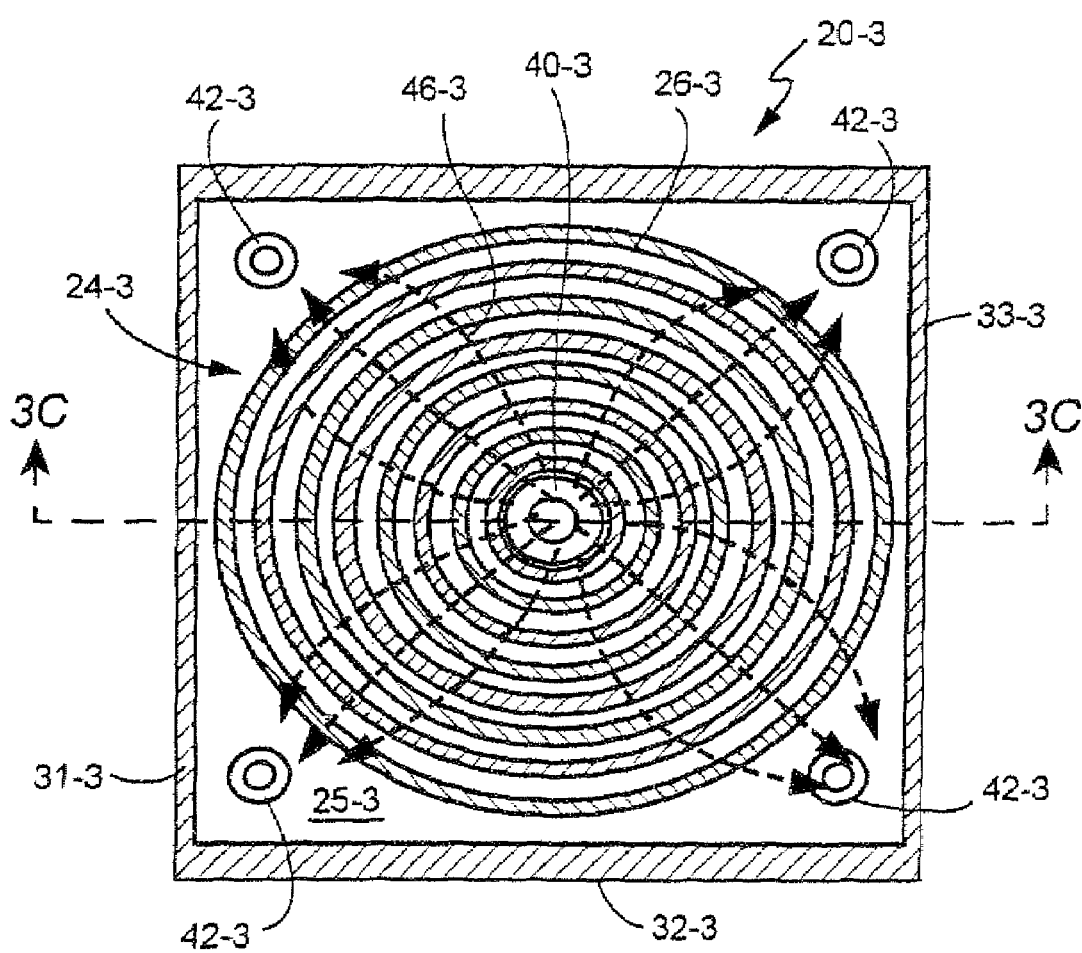
FIG. 3B is a bottom view of the thermal transfer device of FIG. 3A taken along the line 3B-3B.
Figure 3C:
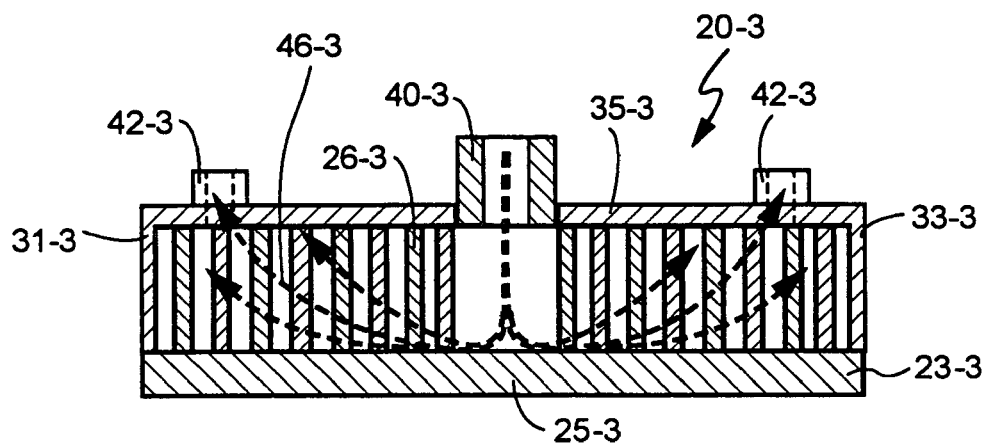
FIG. 3C is a side view of the thermal transfer device of FIG. 3A taken along the line 3C-3C.

FIG. 3A, FIG. 3B, and FIG. 3C illustrate a third example embodiment of a thermal transfer device 20-3. Unless otherwise excepted specifically or by context, comments concerning the first embodiment are also applicable to the third example embodiment. For example, the thermal transfer device 20-3 comprises a housing, with the housing including a cover 22-3 which cooperates with base assembly 23-3 to define chamber 24-3. A thermal core, taking the form of thermal mesh structure 26-3, is situated in chamber 24-3. The thermal mesh structure 26-3 can be a diffusion bonded wire mesh as previously explained, or an expanded metal mesh, or configured in some other manner. The cover 22-3 is essentially a square parallelepiped having an open face and has five walls including side walls 31-3, 32-3, 33-3, and 34-3, as well as cover wall 35-3, but can have other shapes as previously mentioned with respect to other embodiments.

As in the other embodiments, the thermal mesh structure 26-3 is situated in the chamber 24-3 to transfer thermal energy acquired from the thermal transfer base 25-3 to the fluid in the chamber 24-3 as the fluid first impinges upon thermal transfer base 25-3 and then is pumped through interstices of the thermal mesh structure 26-3. As mentioned previously, preferably the thermal mesh structure is formed integrally with or bonded to the thermal transfer base 25-3 (e.g., diffusion bonded in the same or different operation in which the wires of the thermal mesh structure are bonded). As shown in FIG. 3C, the thermal mesh structure 26-3 of the third embodiment has an essentially circular configuration within the chamber, and preferably is configured to comprise plural concentric rings within the chamber.

Figure 3D:
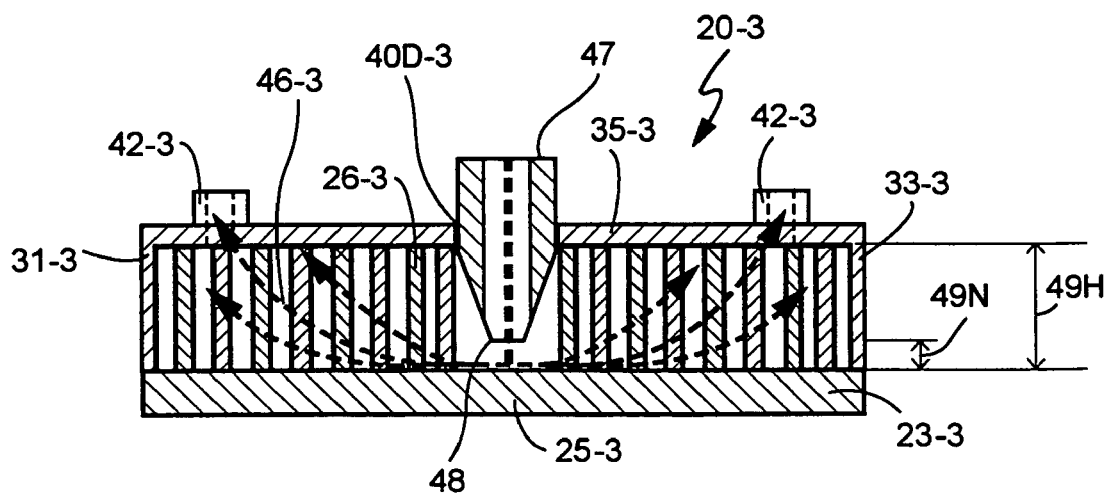
FIG. 3D is a side view of a variation of the third embodiment in which an inlet is an opening through which a nozzle extends.

FIG. 3D shows a variation of the third embodiment in which inlet 40-3 of the housing is an opening through which a nozzle 47 extends. In particular, nozzle 47 extends through an opening in cover 22-3. The nozzle 47 is preferably but not necessarily formed with a tapered distal end, and has an nozzle orifice 48 through which fluid upon discharged impinges essentially immediately and directly upon thermal transfer base plate 25-3. Along a direction orthogonal to a plane of thermal transfer base plate 25-3, a distance 49N separates nozzle orifice 48 from an interior surface of thermal transfer base plate 25-3 while a distance 49H separates an opposite interior surface of the housing (e.g., the interior surface of cover 22-3) from the interior surface of thermal transfer base plate 25-3 (e.g., the distance 49H thus being the height of the chamber 24-3).

The fact that fluid discharged from the nozzle impinges essentially directly and immediately on the thermal transfer base is due to the close proximity of the nozzle orifice 48 to thermal transfer base plate 25-3. Direct and immediate impingement advantageously provides greater impingement velocity.

Thus, in embodiments in which the fluid is introduced centrally into the chamber through an inlet in the port wall, the point at which the fluid is discharged into the chamber 23 may either be situated proximate the port wall as shown in FIG. 3C, or (more preferably) a nozzle 47 may protrude in the manner of FIG. 3D into the thermal transfer chamber 24 so that, upon discharge, the fluid substantially immediately and directly impinges on the thermal transfer base 23.

Figure 4A:
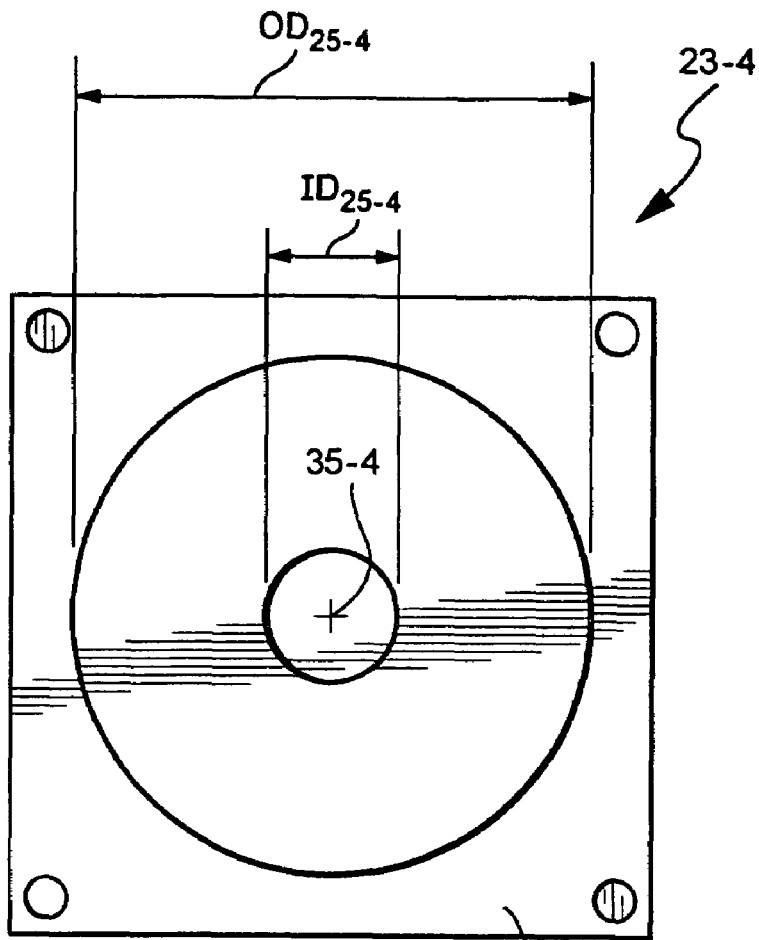
FIG. 4A is a top view of a thermal transfer device according to a fourth example embodiment, with cover removed.
Figure 4B:
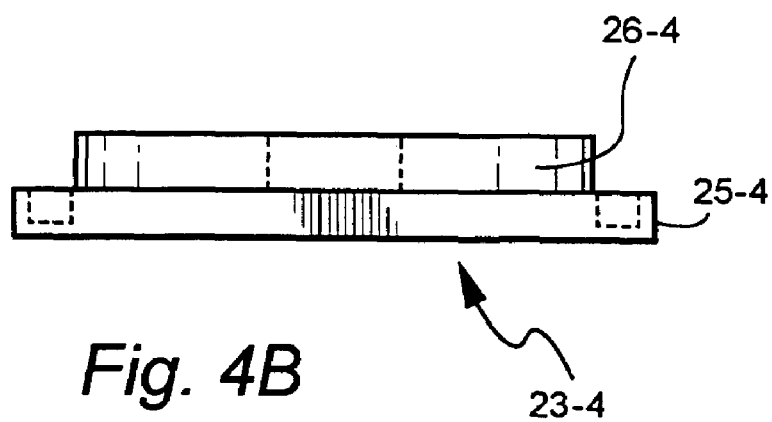
FIG. 4B is a side view of the thermal transfer device of FIG. 4A.
Figure 4C:
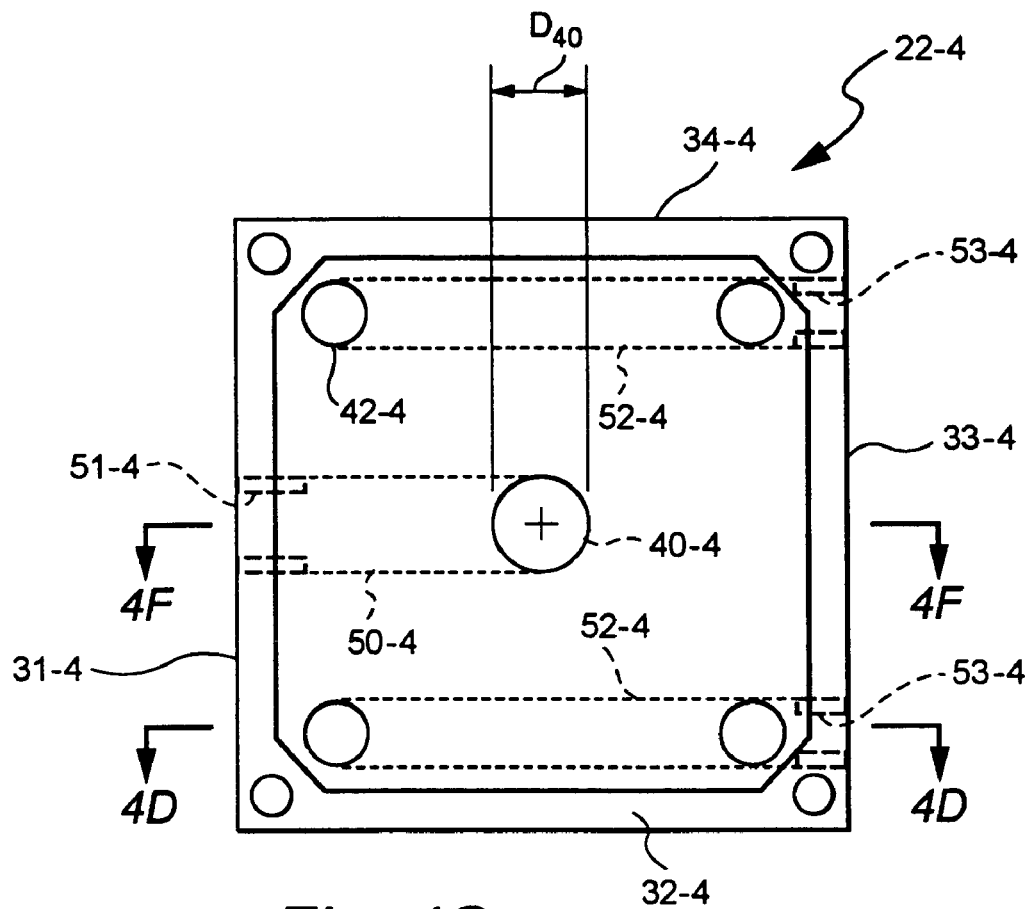
FIG. 4C is a bottom view of a cover for the thermal transfer device of FIG. 4A.

FIG. 4A-FIG. 4F illustrate components of a fourth example embodiment of a thermal transfer device. Unless otherwise excepted specifically or by context, comments concerning the previous embodiments are also applicable to the fourth example embodiment. FIG. 4A and FIG. 4B show base assembly 23-4 with its thermal transfer base 25-4 and its integral core structure (e.g., thermal mesh) 26-4. FIG. 4C-FIG. 4F show cover 22-4 for the fourth embodiment.

The thermal transfer base 25-4 has the thermal mesh structure 26-4 secured to an inside surface thereof by, e.g., diffusion bonding or other technique. Although not illustrated in detail in FIG. 4A and FIG. 4B, the thermal mesh structure 26-4 can have any suitable configuration. For example, the configuration of thermal mesh structure 26-4 can be either the circular configuration of the third embodiment or, more preferably for ease of fabrication, the spiral configuration of the second embodiment. The thermal mesh structure 26-4 can be a diffusion bonded wire mesh as previously explained, an expanded metal mesh, or configured in some other manner. The thermal mesh structure 26-4 has an outer diameter and an inner diameter, illustrated in FIG. 4A as $OD_{25-4}$ and $ID_{25-4}$, respectively. The thermal mesh structure 26-4 has a center axis 35-4 which extends essentially orthogonally from the thermal transfer base 25-4.

Although the mating of cover 22-4 and base assembly 23-4 is not illustrated for the fourth embodiment, it will be appreciated that cover 22-4 fits over base assembly 23-4 to define a chamber in similar manner as previously described embodiments. To this end, fastener holes are provided in aligned fashion proximate corners of both thermal transfer base 25-4 and cover 22-4. The cover 22-4 is essentially a square parallelepiped having an open face and has five walls including side walls 31-4, 32-4, 33-4, and 34-4, as well as cover wall 35-4. The cover 22-4 fits over thermal transfer base 25-4.

Figure 4D:
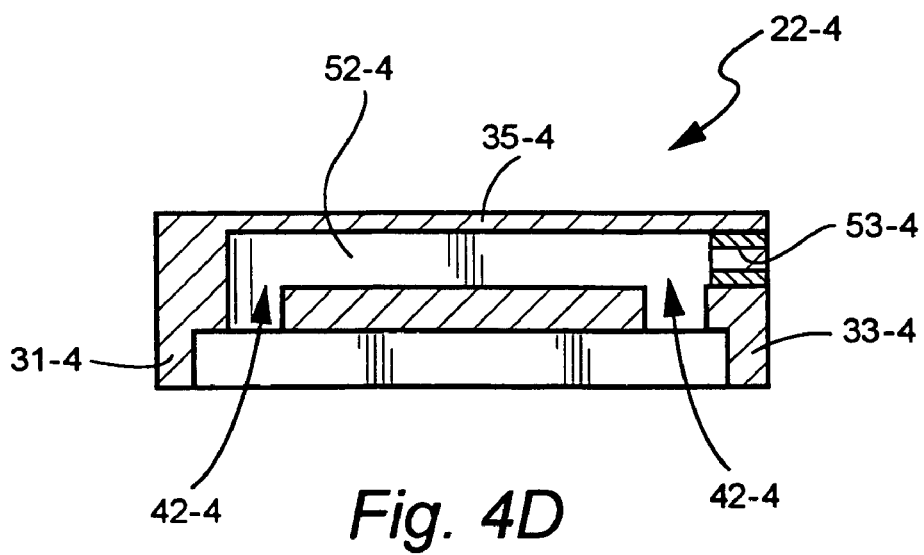
FIG. 4D is a front side view of the cover of FIG. 4C taken along the line 4D-4D.
Figure 4E:
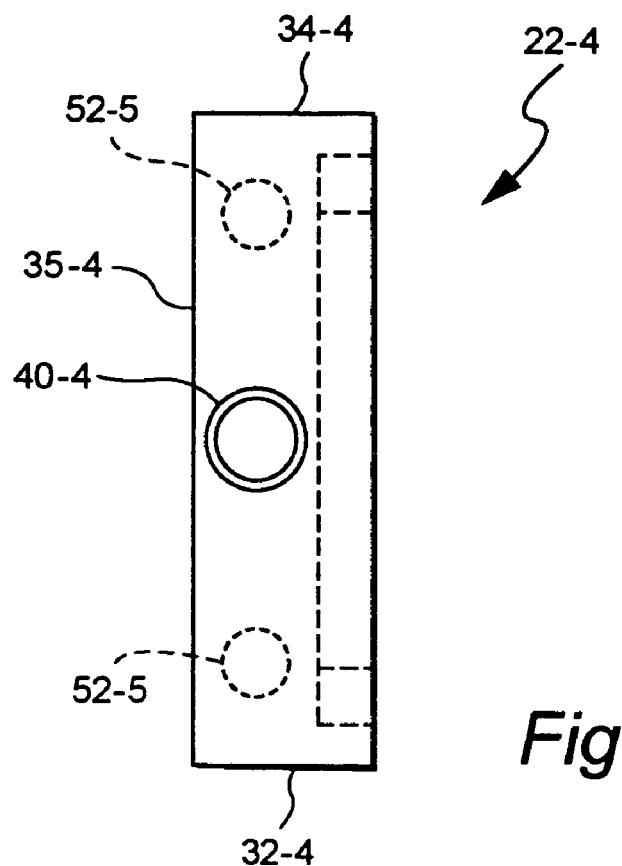
FIG. 4E is a left side view of the cover of FIG. 4C.
Figure 4F:
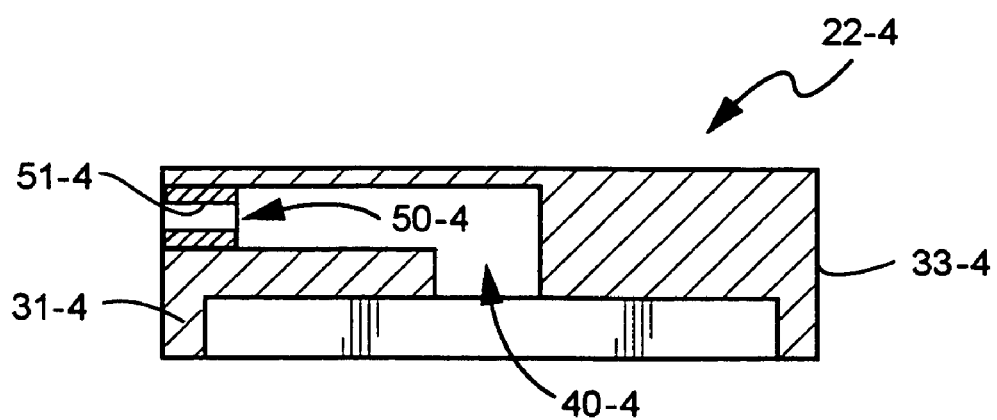
FIG. 4F is a front side view of the cover of FIG. 4C taken along the line 4F-4F.
Figure 5A:
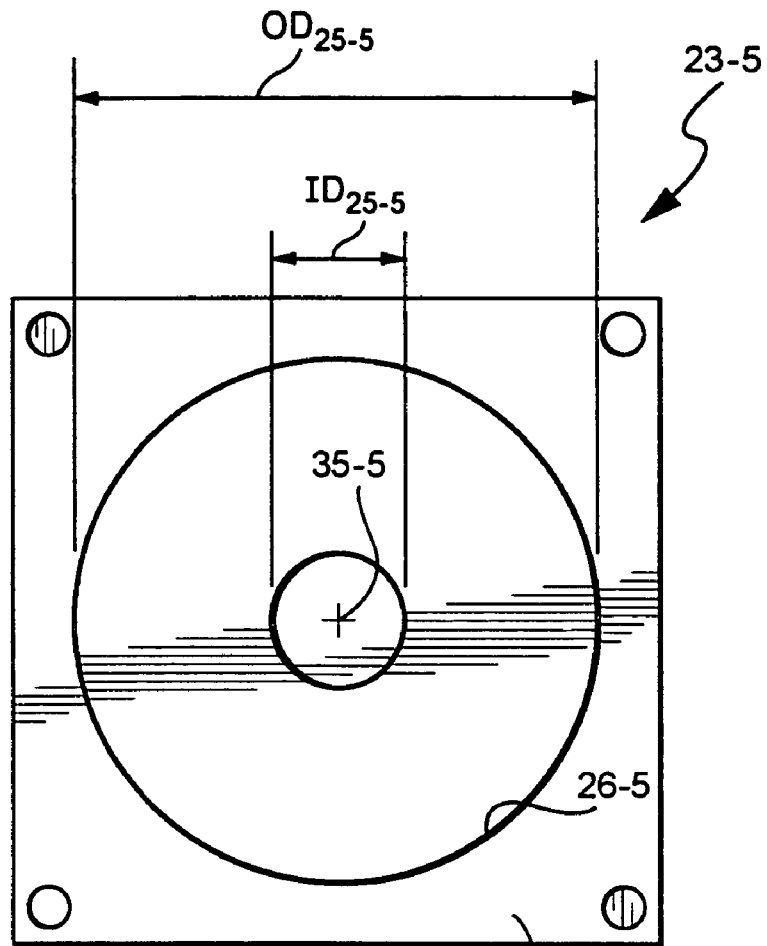
FIG. 5A is a top view of a thermal transfer device according to a fifth example embodiment, with cover removed.
Figure 5B:
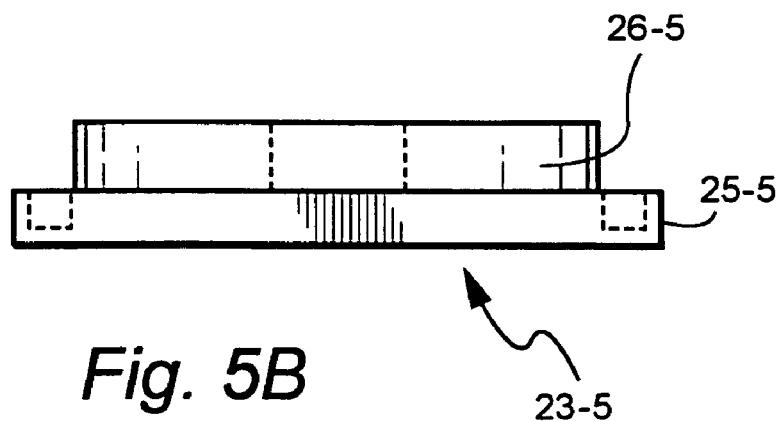
FIG. 5B is a side view of the thermal transfer device of FIG. 5A.
Figure 5C:
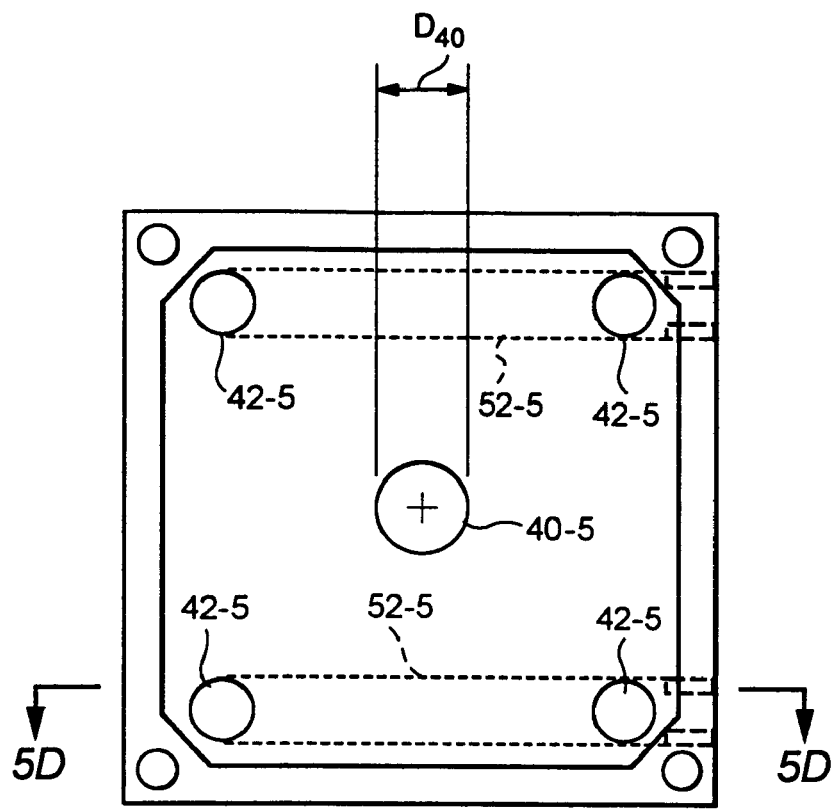
FIG. 5C is a bottom view of a cover for the thermal transfer device of FIG. 5A.
Figure 5D:
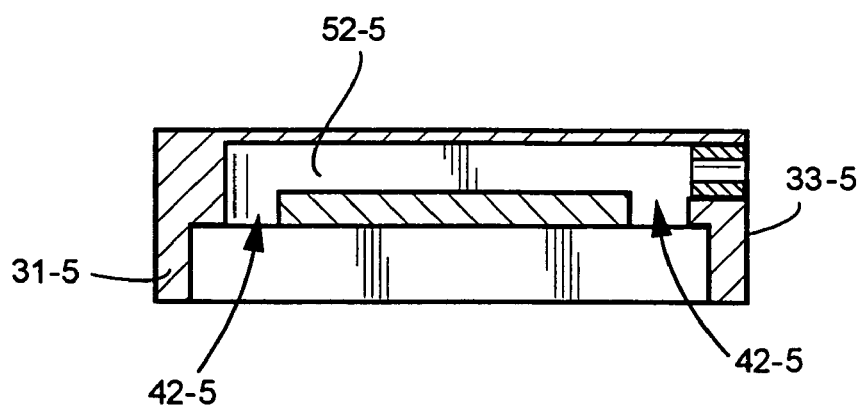
FIG. 5D is a front side view of the cover of FIG. 5C taken along the line 5D-5D.
Figure 5E:
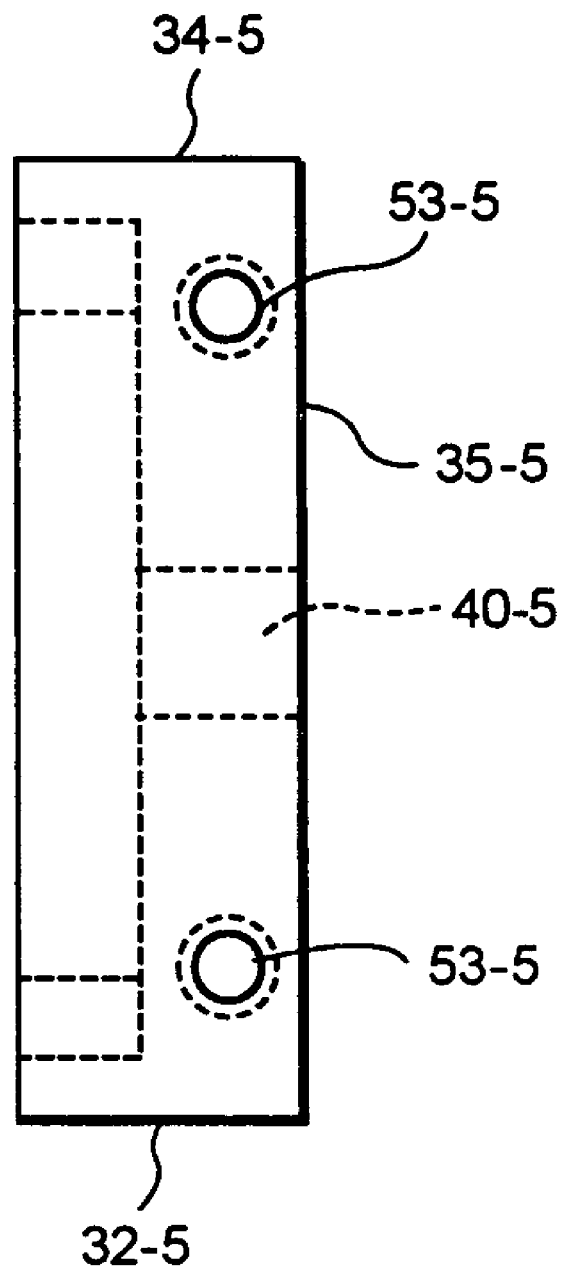
FIG. 5E is a right side view of the cover of FIG. 5C

In the fourth embodiment, the cover wall 35-4 of cover 22-4 includes both a single inlet 40-4, as well as plural (e.g., four) outlets 42-4 (see FIG. 4D). In the illustrated version of the second embodiment, the single inlet 40-4 is centrally located, while each of the four outlets 42-4 are situated in (e.g., proximate) a separate corner of cover wall 35-4. The inlet 40-4 communicates through an inlet channel 50-4 formed in cover 22-4 with an inlet port 51-4 provided on sidewall 31-4 of cover 22-4. The inlet port 51-4 can be threaded or otherwise configured to receive or mate with a tube coupler or the like. Similarly, a pair of two adjacent outlets 42-4 communicate through an associated outlet channel 52-4 to a respective outlet port 53-4 provided on sidewall 33-4 of cover 22-4. The outlet ports 53-4 can also be threaded or otherwise configured to receive or mate with a tube coupler or the like. In the illustrated implementation of the fourth embodiment, the inlet channel 51-4 and the outlet channels 53-4 are perpendicular to the axis of thermal mesh structure 26-4, and thus parallel to the plane of thermal transfer base 25-4. Further, the inlet channel 51-4 and the outlet channels 53-4 have major axes which are parallel to one another. In one example implementation of the fourth embodiment, the diameter of the inlet channel 51-4 is about 0.135 inch while the diameter of the outlet channels is about 0.125 inch. The inlet 40-4 in cover 22-4 has a diameter depicted as $D_{40}$.

The orientation of the inlet channel 51-4 and the outlet channels 53-4 as shown with respect to the fourth embodiment facilitates routing of fluid to the thermal transfer device in a direction which is parallel to the plane of thermal transfer base 25-4, thereby resulting in a shorter form factor which is advantageous for some devices, such as electronic devices including (for example) laptop computers. Other inlet/outlet arrangements are also possible, including further inlets; greater or lesser than four outlets; and differing placements of the inlet(s) and/or outlet(s).

Although the cover 22-4 of the fourth embodiment has the sidewalls, it will be recalled from previous discussion that in the disclosed embodiments the thermal transfer base itself can be configured to have the sidewalls, and that ports can extend through sidewalls formed in such a thermal transfer base.

One example of a different inlet/outlet configuration is shown in a fifth embodiment illustrated in FIG. 5A-FIG. 5E. Elements of the fifth embodiment which are common to the fourth embodiment have similarly numbered reference numerals (excepting suffixes which correspond to the embodiment number). The fifth embodiment essentially differs from the fourth embodiment in that the inlet 40-5 of the fifth embodiment is formed parallel to the axis 35-5 of thermal mesh structure 26-5. Thus, the direction of fluid flow is initially perpendicular to the plane of thermal transfer base 25-5.

Preferably the diameter $D_{40}$ of the inlets 40-4 and 40-5 is greater than the inner diameter $ID_{25-4}$ of the respective thermal mesh structures 26-4 and 26-5. An example and preferred value for the diameter $D_{40}$ of the inlets 40 is 0.171 inch. By having diameter $D_{40}$ of the inlets 40 be greater than the inner diameter $ID_{25}$ of the thermal mesh structures 26, the fluid introduced into the center of the thermal mesh structure 26 is constrained into a smaller volume and rebuffed by the wires at the center of thermal mesh structure 26. Such constraint and interaction causes turbulence in the fluid and increases the pressure involved in the impingement of the incoming fluid on thermal transfer base 25. As indicated previously, the impingement on thermal transfer base 25 causes a further degree of turbulence, which advantageously facilitates greater exposure of the fluid to the metal comprising base assembly 23 and thus increased thermal transfer.

In the fourth embodiment, the right angle bend in the path of the fluid when leaving inlet channel 50-4 and traveling through inlet 40-4 also introduces a measure of turbulence to the incoming fluid. Other ways of providing increased turbulence can also be provided, such as surface irregularities in inlet channel 50-4.

As in the other embodiments, the thermal mesh structures 26 of the fourth and fifth embodiments are situated in the chamber 24 to transfer thermal energy acquired from the thermal transfer base 25 to the fluid in the chamber 24 as the fluid is pumped through interstices of the thermal core (e.g., thermal mesh structure 26). As mentioned previously, preferably the core is formed integrally with or bonded to the thermal transfer base 25 (e.g., diffusion bonded in the same or different operation in which the wires of the thermal mesh structure are bonded).

Figure 6A:
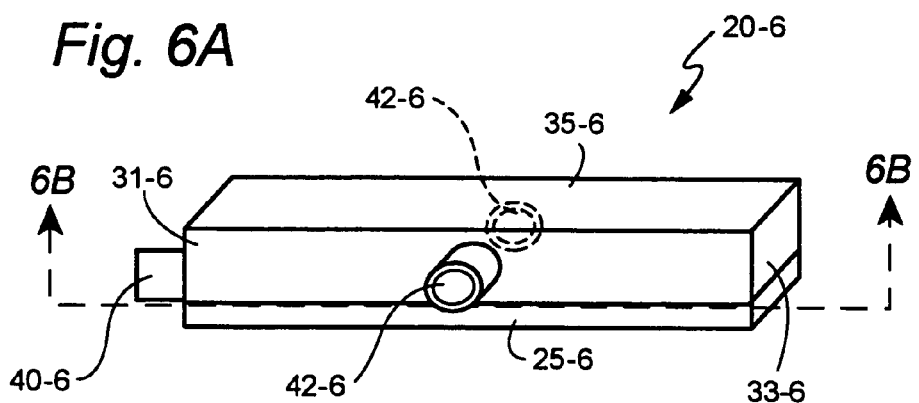
FIG. 6A is a perspective top and side view of a thermal transfer device according to a sixth example embodiment.
Figure 6B:
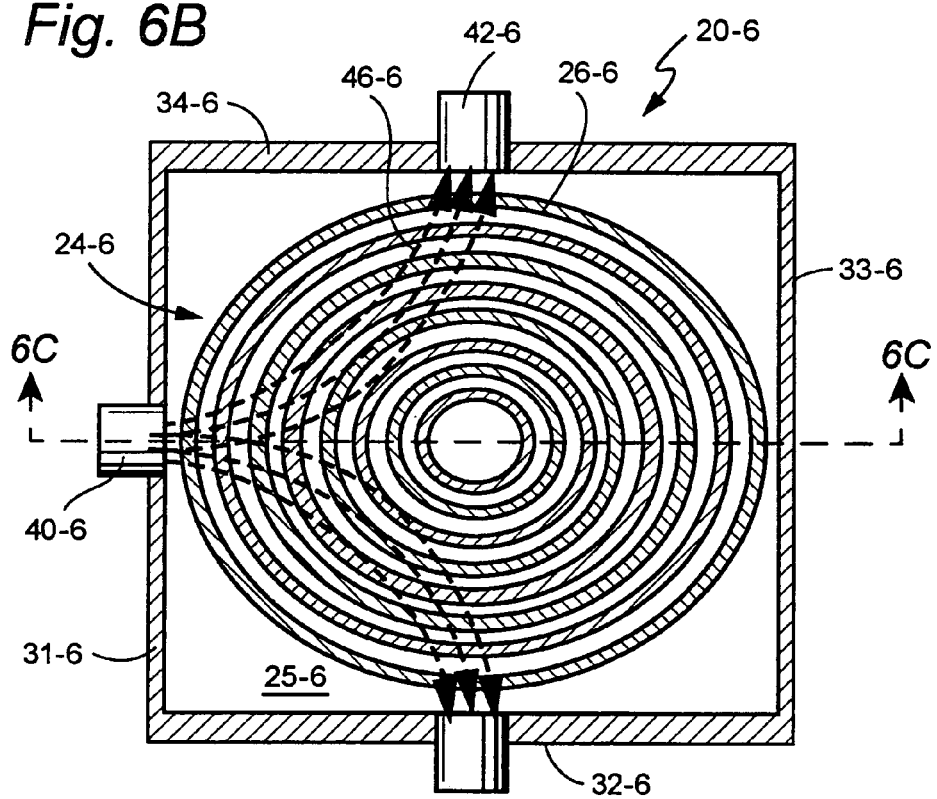
FIG. 6B is a bottom view of the thermal transfer device of FIG. 6A taken along the line 6B-6B.
Figure 6C:
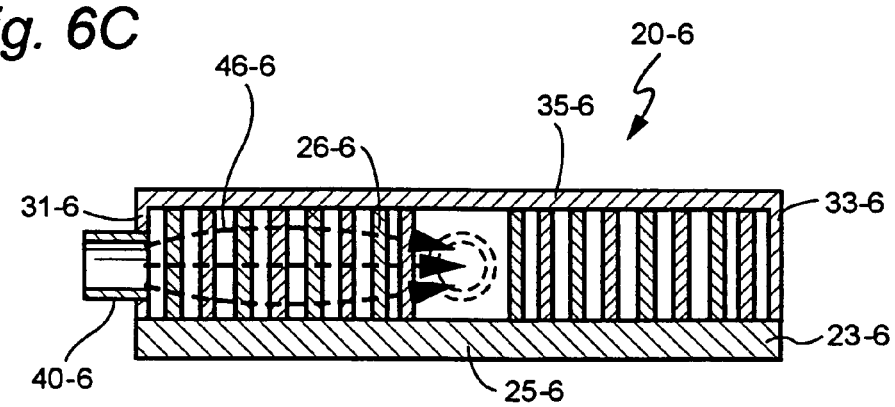
FIG. 6C is a side view of the thermal transfer device of FIG. 6A taken along the line 6C-6C.

FIG. 6A, FIG. 6B, and FIG. 6C illustrate a sixth example embodiment of a thermal transfer device 20-6. For example, the thermal transfer device 20-6 comprises a housing which defines chamber 24-6. The cover 22-6 cooperates with base assembly 23-6 to define chamber 24-6, with cover 22-6 being essentially a square parallelepiped having an open face and has five walls including side walls 31-6, 32-6, 33-6, and 34-6, as well as cover wall 35-6. A thermal core (mesh structure 26-6) of base assembly 23-2 is situated in chamber 24-6. The mesh structure 26-6 of the sixth embodiment and its positioning in the chamber 24-6 essentially is the same as with the second embodiment of FIG. 2A, FIG. 2B, and FIG. 2C. As shown in FIG. 6C, the mesh structure 26-6 of the sixth embodiment has an essentially spiral configuration within the chamber, like that of the second embodiment. The spiral pattern of the mesh structure 26-6 has a first end near the center of the chamber 24-6 and spirals radially outward toward the side walls of chamber 22-6. The mesh structure 26-6 if the sixth embodiment can be a diffusion bonded thermal mesh as previously explained, an expanded metal mesh, or configured in some other manner, e.g., a metallic wool.

In the sixth embodiment the inlet 40-7 and outlets 42-7 are positioned differently than in the second embodiment. Specifically, in the sixth embodiment the inlet 40-7 is formed in sidewall 31-7 of cover 22-7, while two outlets 42-7 are provided on opposing sidewalls 32-7 and 34-7.

Figure 7A:
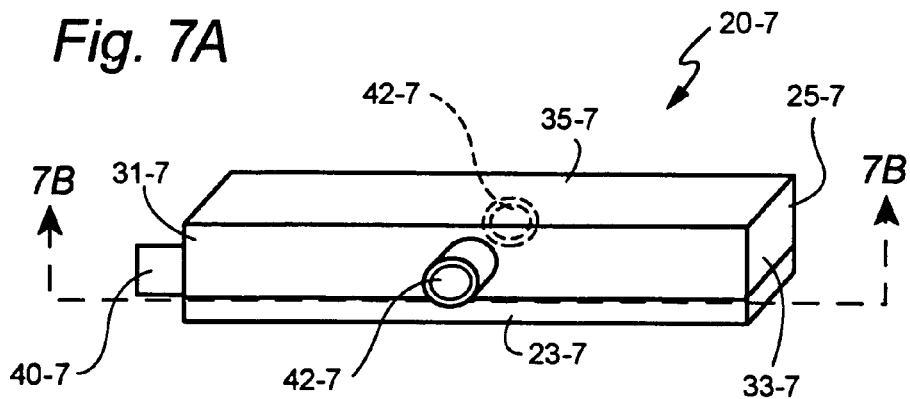
FIG. 7A is a perspective top and side view of a thermal transfer device according to a seventh example embodiment.
Figure 7B:
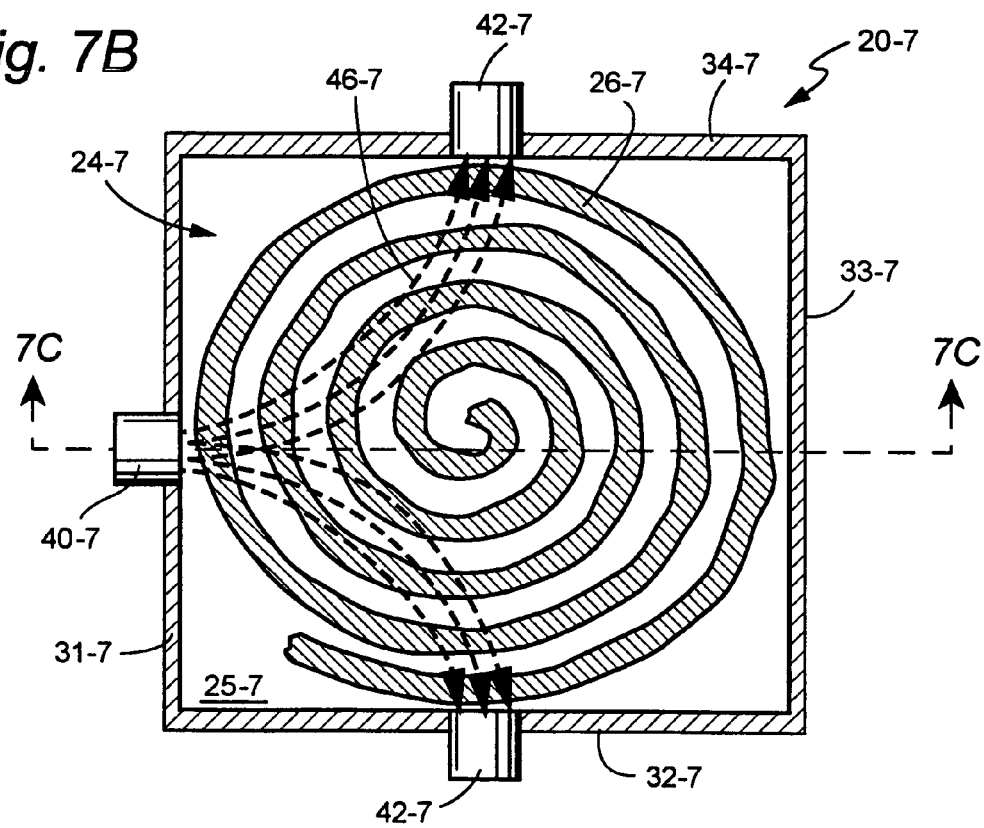
FIG. 7B is a bottom view of the thermal transfer device of FIG. 7A taken along the line 7B-7B.
Figure 7C:
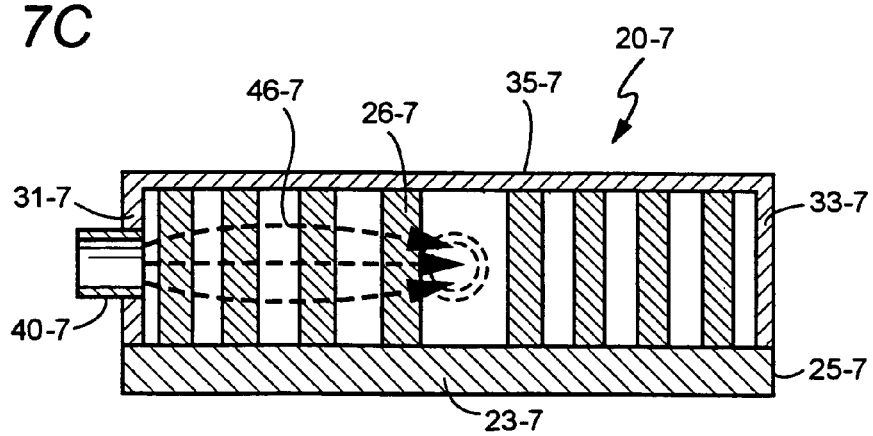
FIG. 7C is a side view of the thermal transfer device of FIG. 7A taken along the line 7C-7C.

FIG. 7A, FIG. 7B, and FIG. 7C illustrate a seventh example embodiment of a thermal transfer device 20-7. For example, the thermal transfer device 20-7 comprises a cover 22-7 which cooperates with base assembly 23-7 to define chamber 24-7. The cover 22-7 is essentially the same as the cover of the sixth embodiment, i.e., a square parallelepiped having an open face and has five walls including side walls 31-7, 32-7, 33-7, and 34-7, as well as cover wall 35-7. A mesh structure 26-7 of base assembly 23-2 is situated in chamber 24-7. The thermal core (e.g., mesh structure 26-7) of the seventh embodiment and its positioning in the chamber 24-7 essentially is the same as with the third embodiment of FIG. 3A, FIG. 3B, and FIG. 3C (or even FIG. 3D). As shown in FIG. 7C, the mesh structure 26-7 of the seventh embodiment has an essentially circular configuration within the chamber, and preferably is configured to comprise plural concentric rings within the chamber.

Thus, in the seventh embodiment, the inlet 40-7 and outlets 42-7 are positioned differently than in the third embodiment. Specifically, in the seventh embodiment the inlet 40-7 is formed in sidewall 31-7 of cover 22-7, while two outlets 42-7 are provided on opposing sidewalls 32-7 and 34-7 (much in the same manner as the inlet and outlet positioning of the sixth embodiment).

The sixth and seventh embodiments can be modified in ways such as those previously mentioned, including (for example) forming the covers with a different shape (such as cylindrical or disk-shaped, or other suitable shape depending on environment of use or application).

The thermal core can be bonded to the housing cover in those embodiments described herein in which there is no gap or separation between the thermal mesh and the housing cover. Such bonding of the thermal core to the housing cover can be by diffusion bonding in those embodiments wherein diffusion bonding is employed, or by other bonding techniques such as those elsewhere mentioned herein.

For embodiments in which the thermal core is a wire mesh, such as a diffusion bonded wire mesh, on average the spacing of wires comprising the mesh are typically uniform, i.e., on average the wires comprising the mesh have the same average in plural (e.g., two) directions. Further, along a direction orthogonal to an inside surface of the thermal transfer base 25, a distance separating a closest wire of the mesh to the inside surface of the thermal transfer base 25 is substantially the same as the pitch of other wires comprising the mesh.

Figure 8A:
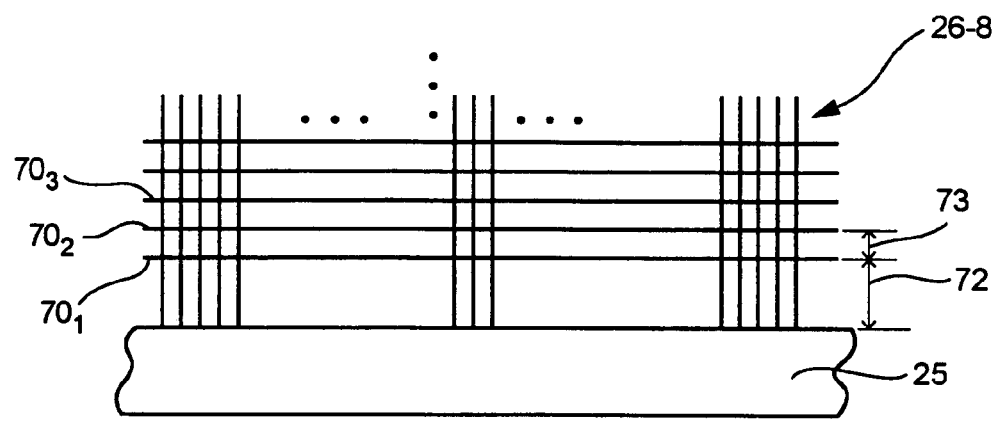
FIG. 8A is a diagrammatic view showing a wire mesh having at least one wire proximate an inside surface of the thermal transfer which has a non-uniform spacing relative to either the thermal transfer base or another wire comprising the mesh.

By contrast, in the mesh embodiment of FIG. 8A, a closest wire $70_1$ parallel to the inside surface of the thermal transfer base 25 is spaced a distance 72 from the inside surface of the thermal transfer base 25 along the direction which is orthogonal to an inside surface of the thermal transfer base 25. The distance 72 is preferably (but not necessarily) a multiple K of the average spacing 74 of other wires of mesh 26-7 (such as, for example, the average spacing 74 separating wires $70_2$ and $70_3$), and thus is non-uniform. The multiple K is preferably an integer multiple such as two, but can be greater.

Although the FIG. 8A embodiment shows only a closest wire $70_1$ parallel to the inside surface of the thermal transfer base 25 as being spaced at a non-standard or non-uniform pitch, it should be appreciated that consonant with this embodiment one or more strands of wire proximate the inside surface of the thermal transfer base 25 may also be spaced in such non-uniform manner. In other words, one or more wires which are parallel to inside surface of the thermal transfer base 25 and in a region proximate the thermal transfer base 25 may have non-uniform spacing relative to either the thermal transfer base 25 or one another. Formation of mesh 26-7 with such non-uniformity proximate the thermal transfer base 25 can be realized by removing, or not forming, the mesh 26-7 with one or more wires. For example, in the FIG. 8A embodiment, formation of the mesh 26-7 could occur by removing a previous closest wire $70_0$.

Providing a non-uniform spacing of wires, particularly a greater spacing of wires, in the region of the thermal transfer base 25 advantageously provides a greater pressure drop at the thermal transfer base, and thus increased turbulence in the flow.

It will be appreciated that the non-uniformity of wire spacing can also be provided in multiple directions. For example, wires can also be strategically non-uniformily spaced in a cross direction or direction which is orthogonal to the plane of the thermal transfer base 25.

Figure 8B:
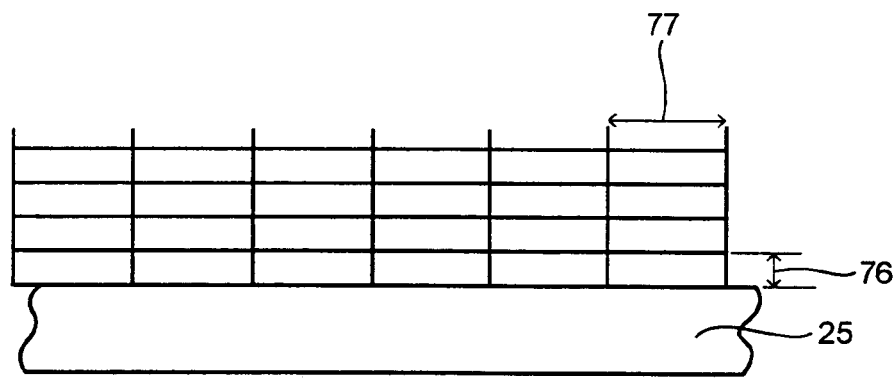
FIG. 8B is a diagrammatic view showing a wire mesh having at a differing wire pitch in differing directions.

FIG. 8B is a diagrammatic view showing yet another embodiment of a wire mesh core in which the wires of the mesh have at a differing wire pitch in differing directions. In particular, a first set of wires which extend in a first direction (e.g., in a plane parallel to the plane of thermal transfer base 25) essentially uniformly have a pitch 76, while a second set of wires which extend in a second direction (e.g., perpendicularly to the plane of thermal transfer base 25) essentially uniformly have a pitch 77. In the illustrated embodiment of FIG. 8B, pitch 77 happens to be greater than pitch 76, although for some applications the converse could occur. While the wires of the first set are shown in FIG. 8B as being perpendicular to the wires of the second set, such need not necessarily be the case. Moreover, the mesh shown in FIG. 8B may also have the non-uniformity described above with reference to FIG. 8A with respect to wires of the first set which are closest to the thermal transfer base 25.

Figure 8C:
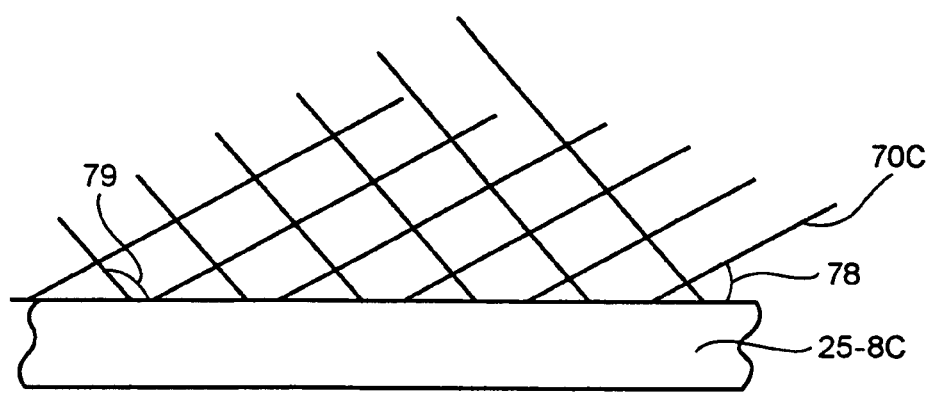
FIG. 8C is a diagrammatic view showing a wire mesh having wires angularly inclined with respect to a thermal transfer base.

In the above regard, it should be understood that the wires of the mesh core need not necessarily be parallel or perpendicular to the plane of thermal transfer base. For example, FIG. 8C shows an embodiment in which the wires 70C of the mesh are angularly inclined with respect to thermal transfer base 25. One set of wires of the mesh are inclined at a first angle 78, while a second set of wires are inclined at a second angle 79. The pitch of the wires 70C of the different sets may differ as explained with reference to FIG. 8B, and moreover some wires of a set such as those closest to the thermal transfer base 25-8C may have non-uniform pitch or spacing.

As mentioned above, the fluid-porous, thermally-conductive mesh structure can comprise a fluid-porous metallic wool, such as brass wool or cooper wool, for example. That is, a fluid-porous metallic wool can be substituted for any of the thermal cores (e.g., meshes) shown in the embodiments described herein.

Figure 9:
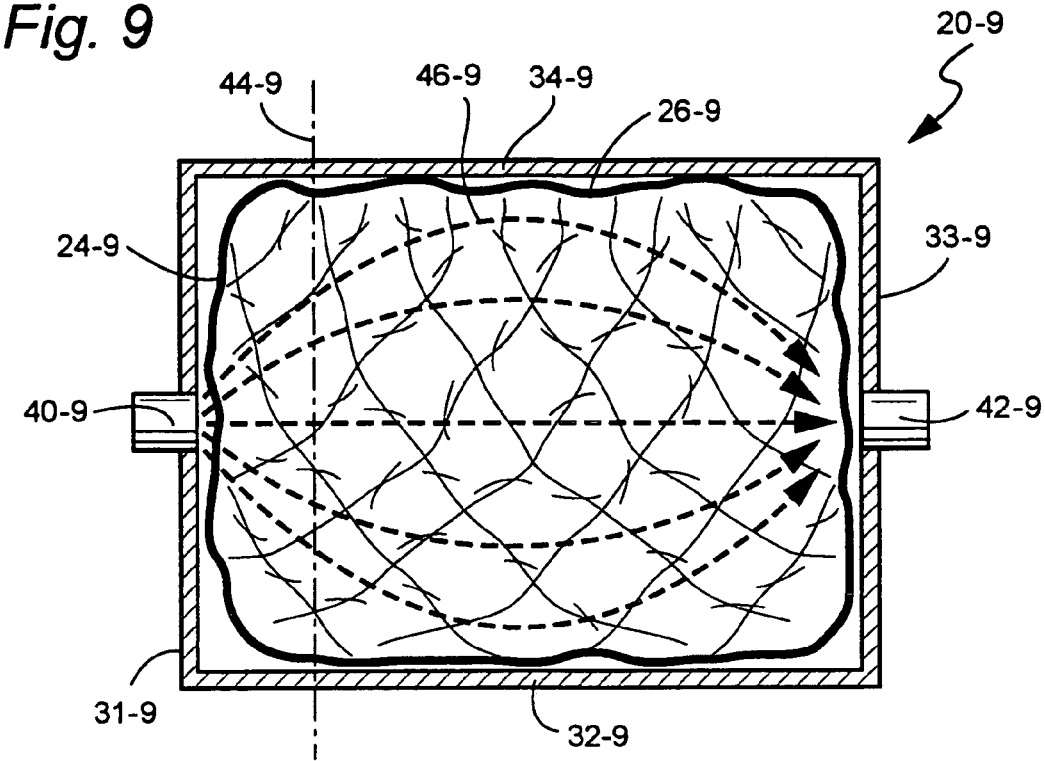
FIG. 9 is a bottom view of the thermal transfer device of FIG. 1A taken along the line 1B-1B, wherein the thermal transfer device has a metallic wool as its thermal mesh.

For example, FIG. 9 shows a ninth embodiment wherein the housing of the thermal transfer device of FIG. 1A can, in its thermal transfer chamber, have metallic wool mesh 26-9 situated therein as its thermal mesh rather than a wire mesh. In particular, in the FIG. 9 embodiment the metallic wool mesh 26-9 is situated in a parallelpiped housing comprised of a thermal transfer base and cover 22-9, with cover 22-9 including side walls 31-9, 32-9, 33-9, and 34-9, as well as cover wall 35-9, in like manner as the FIG. 1 embodiment. FIG. 9 shows the interior of the chamber looking up from cover wall 35-9 toward the underside of thermal transfer base 25-9, thereby also permitting a view of the metallic mesh 26-9. As in the FIG. 1 embodiment, cover 22-9 has an inlet 40-9 through which fluid enters the chamber 24-9 and an outlet 42-9 through which the fluid exits the chamber 24-9, with inlet 40-9 and the outlet 42-9 being provided on opposing sidewalls 31-9 and 33-9, respectively, of cover 22-9. As previously mentioned, other inlet/outlet arrangements are also possible.

The metallic wool mesh 26-9 can have any appropriate shape for occupying the chamber 24-9. For example, the metallic wool mesh 26-9 can have an essentially solid rectangular shape as shown in FIG. 9, or another shape such as a disk shape.

Figure 10:
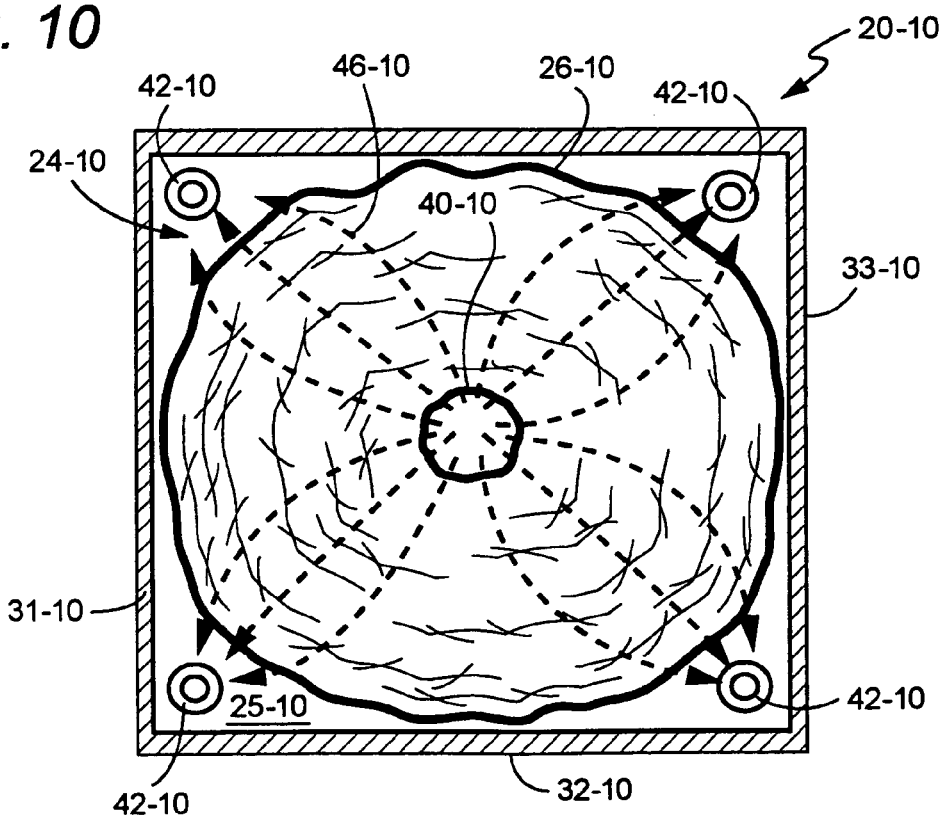
FIG. 10 is a bottom view of the thermal transfer device of FIG. 2A taken along the line 2B-2B, wherein the thermal transfer device has a metallic wool as its thermal mesh.

As another example, FIG. 10 shows that the housing of the thermal transfer device of FIG. 2A or FIG. 3A can, in their thermal transfer chamber, have metallic wool mesh 26-10 situated therein as its thermal core rather than a wire mesh. In particular, in the FIG. 10 embodiment the metallic wool mesh 26-10 is situated in a parallelpiped housing comprised of a thermal transfer base and cover 22-10, with cover 22-10 including side walls 31-10, 32-10, 33-10, and 34-10, as well as cover wall 35-10, in like manner as the FIG. 2 and FIG. 3 embodiments. FIG. 10 shows the interior of the chamber looking up from the thermal transfer base toward the underside of cover wall 35-10, thereby also permitting a view of the metallic wool mesh 26-10. In this tenth embodiment, the cover wall 35-10 of cover 22-10 includes both a single inlet 40-10, as well as plural (e.g., four) outlets 42-10. The illustrated version of the tenth embodiment resembles the second embodiment and third embodiments in that the single inlet is centrally located, while each of the four outlets 42-10 are situated in (e.g., proximate) a separate corner of cover wall 35-10. Other inlet/outlet arrangements are also possible, including plural inlets; greater or lesser than four outlets; differing placements on the cover wall 35-10 (or other housing elements) of the inlet(s) and/or outlet(s); or even providing the inlet(s) and/or outlet(s) on other walls of cover 22-10 or other housing elements.

The metallic wool mesh 26-10 of the FIG. 10 embodiment can have any appropriate shape for occupying the chamber 24-10. Consideration may be given for the fact that the inlet 40-10 is central in the chamber 24-10. For this reason, the metallic wool mesh 26-10 preferably has a torodial or donut shape (particularly if a nozzle is to be centrally accommodated in the chamber and in the mesh), although other shapes for the metallic wool mesh 26-10 are also possible.

Figure 11:
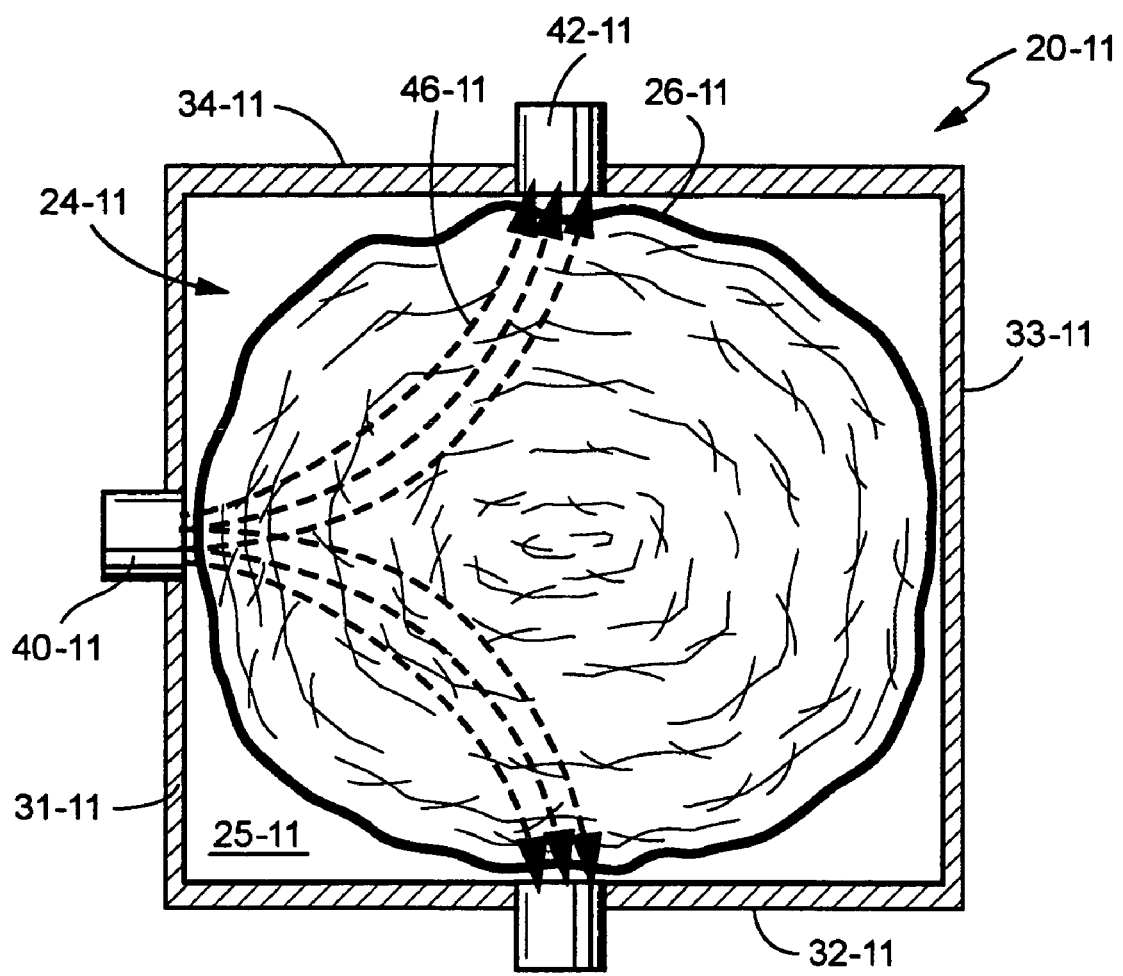
FIG. 11 is a bottom view of the thermal transfer device of FIG. 6A taken along the line 6B-6B, wherein the thermal transfer device has a metallic wool as its thermal mesh.

As yet another example, FIG. 11 shows that the housing of the thermal transfer device of FIG. 6A or FIG. 7A can, in their thermal transfer chamber, have metallic wool mesh 26-10 situated therein as its thermal core rather than a wire mesh or expanded metal mesh. In particular, in the FIG. 11 embodiment the metallic wool mesh 26-11 is situated in a parallelpiped housing comprised of a thermal transfer base and cover 22-11, with cover 22-11 including side walls 31-11, 32-11, 33-11, and 34-11, as well as cover wall 35-11, in like manner as the FIG. 6 and FIG. 7 embodiments. FIG. 10 shows the interior of the chamber looking up from the thermal transfer base toward the underside of cover wall 35-11, thereby also permitting a view of the metallic wool mesh 26-11. As in the sixth and seventh embodiments, in the eleventh embodiment the inlet 40-11 is formed sidewall 31-11 of cover 22-11, while two outlets 42-11 are provided on opposing sidewalls 32-11 and 34-11. The metallic wool mesh 26-11 can have any appropriate shape for occupying the chamber 24-11. For example, the metallic wool mesh 26-11 can have an essentially torodial shape as shown in FIG. 11, or another shape such as a solid rectangular or cubical shape, for instance.

Figure 12A:
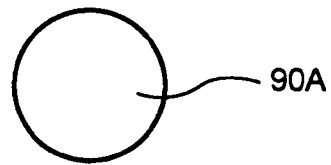
FIG. 12A-FIG. 12F are diagrammatic views showing possible differing cross-sectional configurations of mesh wires.
Figure 12B:
Figure 12C:
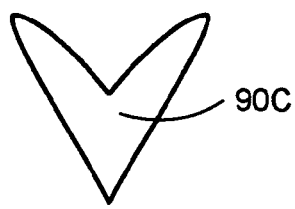
Figure 12D:
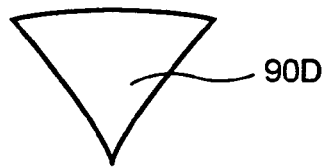
Figure 12E:
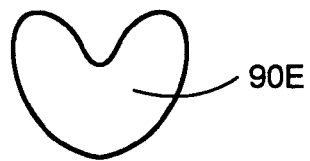
Figure 12F:
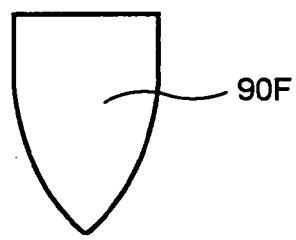

For those embodiments of thermal transfer devices which utilize a wire mesh as the fluid-porous, thermally-conductive core, FIG. 12A-FIG. 12F show possible differing cross-sectional configurations of the mesh wires. FIG. 12A shows wire 90A as having an essentially circular cross sectional configuration. FIG. 12B shows wire 90B as having an essentially flattened circular, or oval, cross sectional configuration. FIG. 12C shows wire 90C as having an essentially triangular cross sectional configuration. FIG. 12D shows wire 90D as having an essentially strict chevron cross sectional configuration. FIG. 12E shows wire 90E as having an essentially rounded or snubbed chevron cross sectional configuration. FIG. 12F shows wire 90F as having an essentially bullet shaped cross sectional configuration. Each of these wire cross sectional configurations provide a different degree of exposure (e.g., surface area) for promoting thermal transfer. Further, the cross sectional shapes of the wires contribute to a pressure differential which affects tortuous flow, and thus the degree of thermal transfer.

Thermal transfer devices such as the example cooling assemblies described by way of the non-limiting and representative examples above are useful in a thermal dissipation system in which the thermal transfer base of the thermal transfer device is situated in thermal conducting relation with a body to be thermally treated, and which further includes a pump and optionally includes a thermal exchanger. Although the embodiments illustrated herein include a thermal exchanger, it is possible in some applications that the thermal exchanger may be omitted if there is sufficient cooling of the cooling fluid by remaining elements of the system.

Figure 13A:
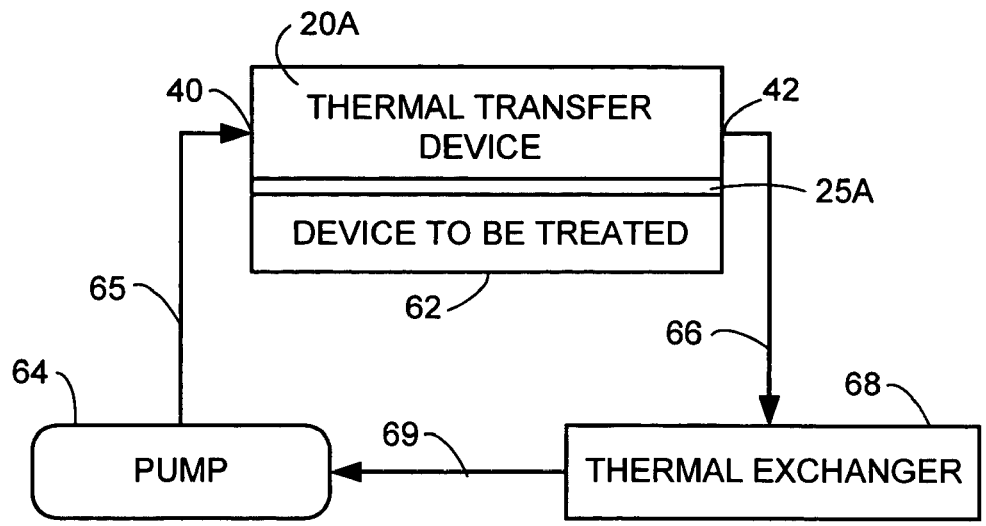
FIG. 13A-FIG. 13F are schematic views of differing, example thermal dissipation systems which include a representative, generic thermal transfer device.

FIG. 13A illustrates one such thermal transfer system 60A wherein thermal transfer base 25A of thermal transfer device 20A is in thermal conducting relation with body to be thermally treated 62. An output side of pump 64 is connected by tube 65 to inlet 40 of thermal transfer device 20A. An outlet 42 of thermal transfer device 20A is connected by tube 66 to an intake port of thermal exchanger 68. An output port of thermal exchanger 68 is connected to an intake side of pump 64. The pump 64 serves to move fluid through a circulation path including tube 65, thermal transfer device 20A, tube 66, thermal exchanger 68, and tube 69. The circulation path is configured so that after the thermal energy is transferred to the fluid in the thermal transfer device 20A, the fluid is cooled by the thermal exchanger 68 prior to the fluid being circulated back to the thermal transfer device 20A.

Figure 13B:
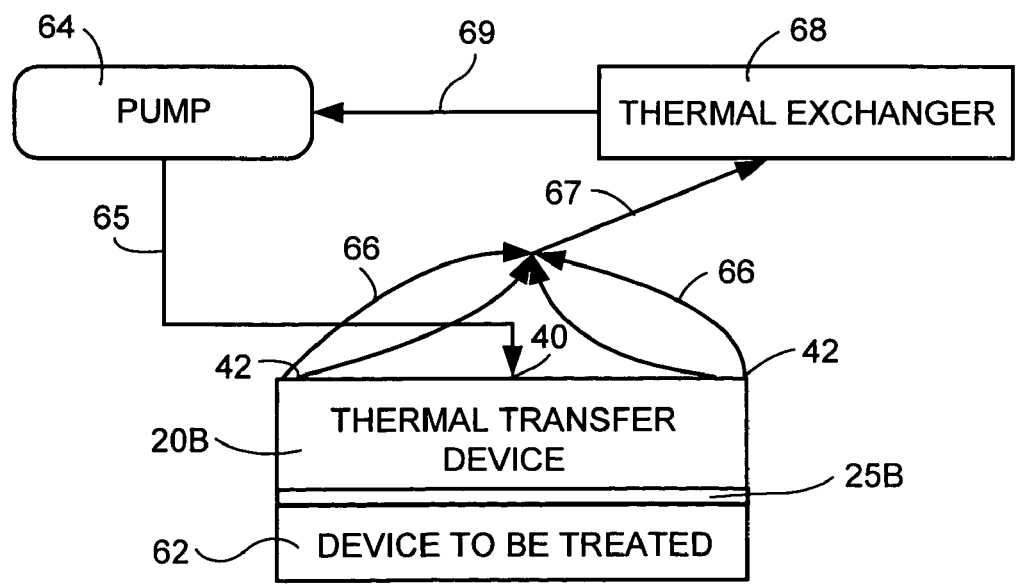

While the thermal transfer system of FIG. 13A is more appropriate for a thermal transfer device having a single inlet and single outlet such as thermal transfer device 20-1 previously described, other versions of appropriate thermal transfer systems can also be designed. For example, the thermal transfer system of FIG. 13B is suitable for a thermal transfer device (such as thermal transfer devices 20-2 and 20-3) having multiple outlets 42. FIG. 13B shows each of the four outlets 42 being connected to an associated tube 66, with the four tubes 66 being connected together or otherwise joined into a single tube 67. FIG. 13B thus illustrates that, in embodiments in which the housing has plural outlets 42, downstream from the outlets the outlets may be connected to a common discharge tube.

Figure 13C:
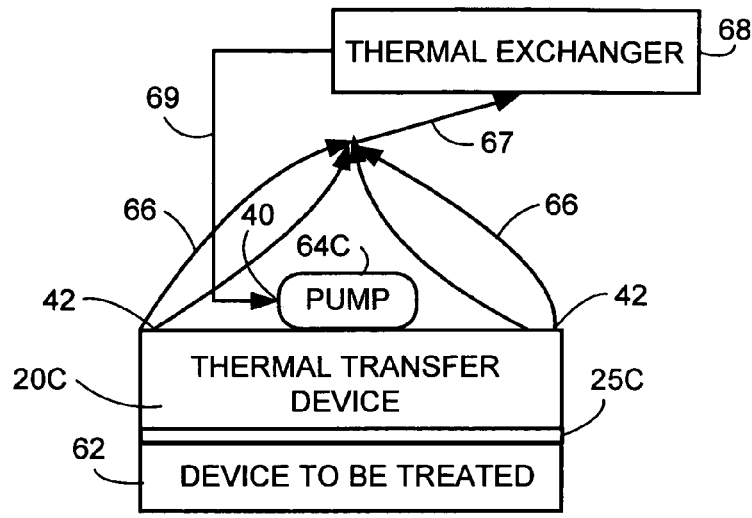

FIG. 13C shows by way of illustration that the pump 64C may be proximate to or formed integral with thermal transfer device 20C. Such juxtaposition of pump and sink can be utilized for various embodiments, not just the particular configuration shown in FIG. 13C.

Figure 13D:
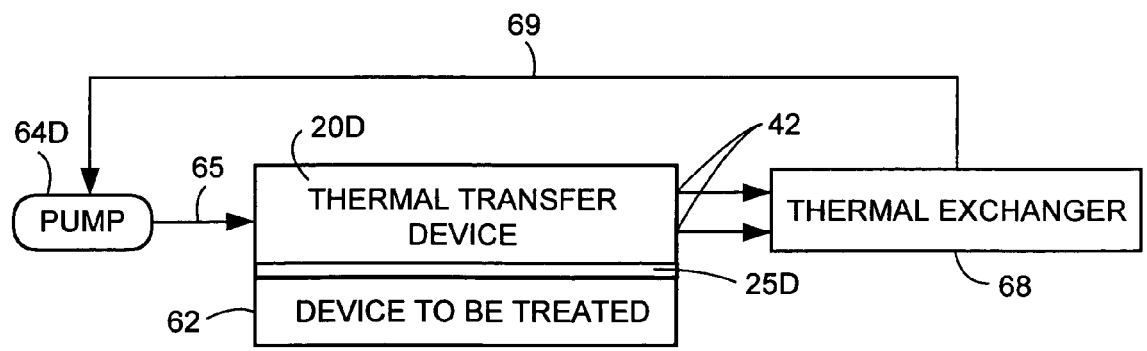
Figure 13E:
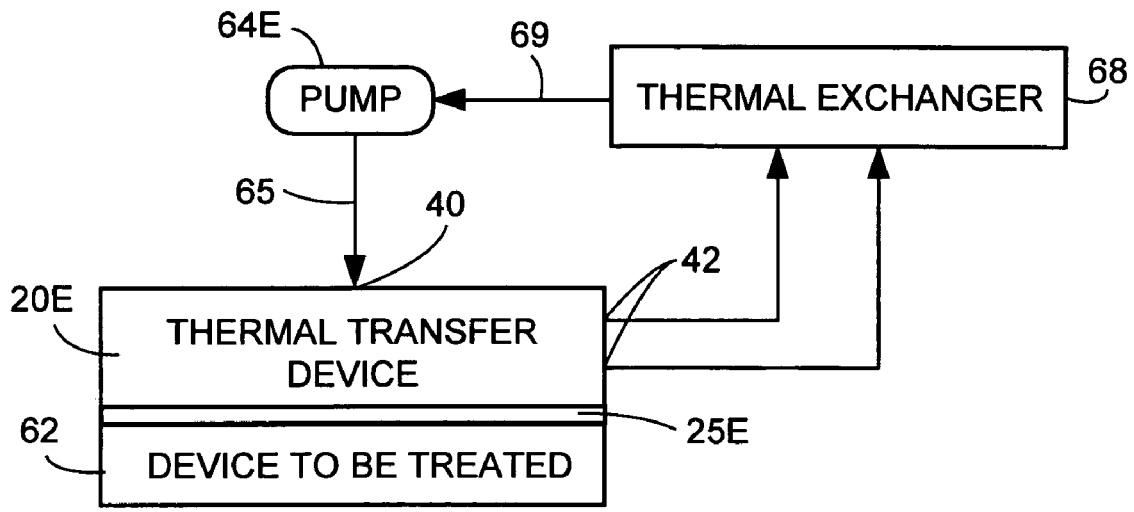

FIG. 13D and FIG. 13E show example thermal transfer systems which can be respectively utilized for the fourth and fifth above-described embodiments of thermal transfer device assemblies. The FIG. 13D thermal transfer system is particularly attractive for its low form factor, especially when the pump 64D, thermal transfer device 20D, and (optional) thermal exchanger 68 are located in essentially planar fashion.

Figure 13F:
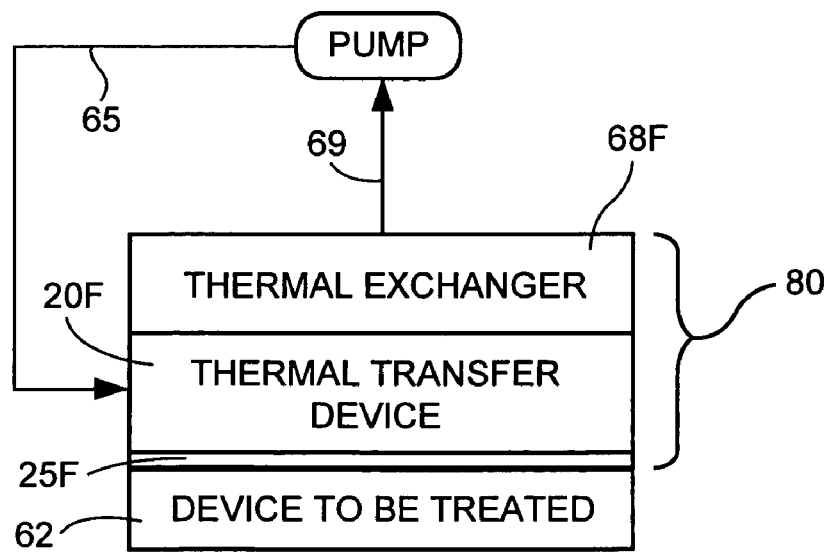

FIG. 13F illustrates a thermal transfer system 60F in which the thermal transfer device 20E is combined with the thermal exchanger 68F to form an integral cooling/exchanger device 80. In thermal transfer system 60F, thermal transfer base 25F of thermal transfer device 20F is in thermal conducting relation with body to be thermally treated 62. An output side of pump 64 is connected by tube 65 to inlet 40 of thermal transfer device 20F. With the thermal transfer device 20F being integrated with the thermal exchanger 68F, an outlet of the thermal transfer device permits direct flow of fluid from thermal transfer device 20F into thermal exchanger 68F as depicted by arrow 82 in FIG. 8F. As in other embodiments, an output port of thermal exchanger 68F (integral with thermal transfer device 20F) is connected to an intake side of pump 64. The pump 64 serves to move fluid through a circulation path including tube 65, thermal transfer device 20F and its integral thermal exchanger 68F, and tube 69. The circulation path is configured so that after the thermal energy is transferred to the fluid in the thermal transfer device 20F, the fluid is cooled by the thermal exchanger 68F prior to the fluid being circulated back to the thermal transfer device 20F.

In the thermal transfer systems contemplated herein, the body to be thermally treated 62 can be any body which generates or radiates heat, such as a die for a microprocessor, microelectronic device, or other electronic chip, for example. In such case, FIG. 13A and FIG. 13B illustrate a closed loop electronic cooling application for picking up heat generated by a microprocessor or other electronic device such as a device which executes coded or otherwise programmed instructions.

For embodiments in which the thermal mesh is a wire mesh (as opposed to an expanded metal mesh, for example, the wire mesh structure is comprised of wire having a suitable gauge and mesh size for the intended application. Mesh size refers to the number of wire strands per linear inch. It is believed that selection of wire gauge and mesh size is interdependent. For a thermal transfer device utilized for the cooling of electronic the wire mesh structure can have, e.g., a diameter in a range from about 0.0055 inch to about 0.016 inch, and a mesh size less than 100, preferably in a range from about 20 to 80 mesh, and more preferably in a range from and including about 40 mesh to and including about 50 mesh.

The height of the thermal mesh structures 26 described herein, i.e., the extent of the thermal mesh structures in a distance perpendicular to the plane of the thermal transfer base 25, is preferably in a range of from about 0.125 inch to about 0.375 inch.

The fusing of the wire in the wire mesh structures which serve as the thermal core allows for higher efficiency in transferring thermal energy from a plate to the wire mesh. The fusing results in very many channels or interstices in the thermal mesh, making it easier to push the fluid through the thermal transfer device and thereby significantly reducing the size and power of the pump which pushes the fluid. Moreover, the thermal transfer efficiency is increased due to the fact that the thermal mesh has such a large surface area. The surface area of a thermal mesh can be as much as or more than five times greater than the surface area of a microchannel type heat sink.

In some example embodiments the thermal core comprises extruded metal which has been stretched (using, e.g., heat treatment) and scored, punctured, or otherwise deformed to form channels which facilitate fluid flow.

For some or all embodiments described herein, the cover 22 can be fabricated from any suitable plastic, such as acetal (e.g., Delrin™ provided by DuPont), PVC, polyethylene, or polypropylene. The cover 22 can also be fabricated from a metal, such as copper. In some embodiments, the thermal exchange occurring in the chamber 24 may be sufficiently efficient and effective that the cover 22 need not also be thermally conductive. Even in embodiments having a metallic cover there is little noticeable thermal change in the cover. Such being the case, lighter-than-metal materials are preferred for fabrication of the cover. Yet, if desired, in some embodiments the cover can be metallic and can be bonded to the mesh, as described above.

In some embodiments, when pumping 600 ml of fluid less than about 0.5 psi of pressure is required, and preferably about 0.4 psi or less. Thus, the thermal transfer devices operate in a low pressure environment/application, i.e., below 3.0 psi.

In comparison to microchannels, wire channels and especially diffusion bonded wire channels or expanded metal channels provide more surface area over which fluid can pass. Therefore, these channels transfer more thermal energy into the fluid traveling therethrough. Whereas microchannel devices have a discrete and fairly low number of possible (unidirectional) fluid paths, embodiments of the thermal transfer device assemblies described herein have myriad possible paths and combinations of paths through, e.g., the interstices of the thermal mesh structure. Moreover, the configurations of the paths and mesh nature of the thermal mesh structure, in addition to the impingement effect upon introduction into the chamber, impart turbidity to the fluid. Accordingly, essentially all of the fluid is exposed to the thermal transfer metal (e.g., either the thermal transfer base or the thermal mesh structure) at some point in its travel. Further, as mentioned previously, the number of tortuous channels formed by the thermal mesh has low pressure drop.

While rectangular and/or square parallelepiped housings have been illustrated for the example embodiments, other shape housings are also contemplated. In fact, the housings can be of any geometrical design so long as sized and configured to accommodate the particular thermal mesh structure contained therein. For example, other housing configurations include circular or oval housings, and even housings of irregular shape. Moreover, while the housings of the examples illustrated herein are essentially two piece in having a base plate or thermal transfer base on one hand and a cover member on the other, the housing can be otherwise formed.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A thermal transfer device comprising:
   a housing which includes a thermal transfer base for providing thermal transfer for a component to be thermally treated;
   a chamber at least partially defined by the housing, the chamber having an inlet through which fluid enters the chamber and an outlet through which the fluid exits the chamber;
   a fluid-porous, thermally-conductive wire mesh structure situated in the chamber in thermal conducting relation with the thermal transfer plate for transferring thermal energy acquired from the thermal transfer base to the fluid in the chamber as the fluid travels through interstices of the wire mesh structure, the wire mesh structure being one of a diffusion bonded wire mesh and an expanded metal wire mesh;
   wherein the wire mesh structure has an opening aligned with the inlet, and further comprising a nozzle which extends through the inlet so that fluid discharged from the nozzle impinges through the opening and essentially directly on the thermal transfer base.

2. The apparatus of claim 1, wherein the outlet is positioned so that in the chamber fluid travels in a radial direction with respect to the wire mesh structure for exiting the chamber.

3. The apparatus of claim 1, wherein the fluid is a liquid.

4. The apparatus of claim 1, wherein the wire mesh structure has a mesh size in a range of less than 100 mesh.

5. The apparatus of claim 1, wherein the mesh structure comprises a first set of wires which extend in a first direction and which essentially uniformly have a first pitch and a second set of wires which extend in a second direction and which essentially uniformly have a second pitch, and wherein the first pitch is not equal to the second pitch.

6. The apparatus of claim 1, wherein the housing comprises a cover, wherein the cover has an open face and side walls, and a port wall which is opposite the thermal transfer base, and wherein the inlet and the outlet are provided on the port wall.

7. The apparatus of claim 6, wherein the inlet is provided in a center of the port wall.

8. The apparatus of claim 7, wherein the outlet is positioned so that in the chamber fluid travels in a radial direction with respect to the wire mesh structure for exiting the chamber.

9. The apparatus of claim 7, wherein the outlet is provided proximate a corner of the port wall.

10. The apparatus of claim 7, further comprising plural outlets, and wherein each of the plural outlets is provided proximate a respective corner of the port wall.

11. The apparatus of claim 1, wherein the mesh is bonded to the thermal transfer base.

12. A thermal transfer system comprising:
a body to be thermally treated;
a thermal transfer device according to claim 1,
a pump which pumps fluid through a circulation path including the cooling device.

13. The apparatus of claim 12, further comprising a thermal exchanger included in the circulation path, the circulation path being configured so that after the thermal energy is transferred to the fluid in the cooling device the fluid is cooled by the thermal exchanger prior to the fluid being circulated back to the cooling device.

14. The apparatus of claim 13, wherein the thermal exchanger is integral with the thermal transfer device.

15. A thermal transfer system comprising:
an electronic component to be cooled;
a cooling device comprising:
    a housing including a thermal transfer base, the thermal transfer base being situated in thermal conducting relation with the electronics component;
    a chamber at least partially defined by the housing, the chamber having an inlet through which coolant liquid enters the chamber and an outlet through which the coolant liquid exits the chamber;
    a liquid-porous, thermally-conductive wire mesh structure situated in the chamber in thermal conducting relation with the thermal transfer plate for transferring thermal energy acquired from the thermal transfer base to the liquid in the chamber as the liquid travels through interstices of the wire mesh structure toward the outlet, the wire mesh structure having an opening aligned with the inlet;
    a nozzle which extends through the inlet so that fluid discharged from the nozzle impinges through the opening and essentially directly on the thermal transfer base.

16. The apparatus of claim 15, wherein the inlet is provided on a wall of the housing which is opposite the thermal transfer base.

17. The apparatus of claim 15, extends interiorly into the housing.

18. The apparatus of claim 15, wherein the wire mesh structure is one of a diffusion bonded wire mesh or an expanded metal wire mesh.

19. The apparatus of claim 12, wherein fluid-porous core is bonded to the thermal transfer base.

20. A thermal transfer device comprising:
a housing which includes a thermal transfer base for providing thermal transfer for a component to be thermally treated;
a chamber at least partially defined by the housing. the chamber comprising an inlet throuah which fluid enters the chamber and an outlet through which the fluid exits the chamber:
a fluid-porous core connected to the thermal transfer base. the fluid-porous core comprising a spiral shape and comprising a spiral wound wire mesh or expanded metal. the fluid-porous core being situated in the chamber to transfer thermal energy acquired from the thermal transfer base to the fluid in the chamber as the fluid travels through interstices of the fluid-porous core:
a nozzle configured to extend through the inlet so that fluid discharged from the nozzle impinges through a center of the spiral shape of the core and essentially directly on a center of the thermal transfer base.

21. The apparatus of claim 20, wherein the chamber comprises plural outlets provided at plural locations of the chamber, and wherein the plural outlets are connected.

* * * * *